(12) United States Patent
Iversen et al.

(10) Patent No.: US 6,384,492 B1
(45) Date of Patent: *May 7, 2002

(54) POWER SEMICONDUCTOR PACKAGING

(75) Inventors: Arthur H. Iversen, Saratoga; George Gabor, Lafayette, both of CA (US)

(73) Assignee: Spinel LLC, Lafayette, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/305,555

(22) Filed: May 5, 1999

Related U.S. Application Data

(63) Continuation-in-part of application No. 08/435,782, filed on May 4, 1995, now Pat. No. 6,002,183.

(51) Int. Cl.$^7$ ............................................. H01L 25/00
(52) U.S. Cl. ................... 307/147; 307/131; 307/150; 257/691; 257/713; 257/724; 327/564; 327/565
(58) Field of Search ................................. 307/147, 150, 307/131, 32, 34; 327/564, 565; 257/641, 713, 724

(56) References Cited

U.S. PATENT DOCUMENTS 4,067,040 A * 1/1978 Tsuzuki .................... 257/705
6,002,183 A * 12/1999 Iverson et al. ............. 307/147

* cited by examiner

*Primary Examiner*—Albert W. Paladini
(74) *Attorney, Agent, or Firm*—Armstrong Teasdale LLP

(57) ABSTRACT

Power output switching circuit for use in high current and high frequency applications. The output circuit provides a series of geometrically symmetric, parallel spaced semiconductor converters arranged such that the voltage for each semiconductor output device is substantially equal and minimal for each device. In this way, each device exhibits substantially the same impedance, such that circuit performance is largely a function of intrinsic device characteristics, and substantially independent of cross coupling and other external influences.

25 Claims, 24 Drawing Sheets

Power Control Unit with A single Cluster

NOTATION:
Unit Level - Connections
Cluster Level - Terminals
Die / Device Level - Ports A MOSFET Semiconductor Die / Chip A MOSFET Semiconductor Die in a Device package Parallel - Series Power Unit Configurations
to provide Power Output Drivers Basic Power Control Unit Parallel Power Control Units Series Power Control Units Series - Parallel Power Control Units Power Control Units in
Flat Geometries with total current paths Micro - Strip Configuration Strip Line Configuration Four sided to infinite sided Coaxial Geometries Coaxial Power Control Unit folded to minimize Impedance

POWER SEMICONDUCTOR PACKAGING

CROSS REFERENCE TO RELATED APPLICATION

This application is a continuation in part of U.S. patent application Ser. No. 08/435,782 filed May 4, 1995 which is now U.S. Pat. No. 6,002,183 issued Dec. 14, 1999.

TECHNICAL FIELD

The present invention relates, generally, to power output, switching circuitry incorporating multiple paralleled semiconductors carrying high current or operating at high frequencies, and more particularly to power output drivers with ratings in the range of one kilowatt and above and employing signal frequencies in the range of 10 Khz, including power converters for AC to AC, DC to DC, AC to DC, DC to AC, and power amplifiers of the A, AB, B, C and D types and their various subtypes.

BACKGROUND OF INVENTION

The performance of semiconductor circuit designs employing multiple paralleled devices operating at high currents and/or at high frequencies, e.g., above 10 Khz, is often limited by the mutual interaction of the paralleled devices. In particular, conventional power converter performance is limited in the frequency-power products available. There are high power converters in the sub-hundred kilowatt to multi-megawatt range that employ switching frequencies in the 1-kHz range using SCRs (Silicon Controlled Rectifiers), thyristors and GTOs. In the tens of kilowatt range with switching frequencies from about 1 kHz to about 10 kHz, converters often use, for example, IGBTs (Insulated Gate Bi-Polar Transistors) and Bi-Polar power devices. Higher frequency operation with IGBTs and Bi-Polar devices is accomplished with higher losses, more complexity, restrictive performance and increased expense. A particularly suitable device for high frequency converter operation is the power MOSFET (Metal Oxide Silicon Field Effect Transistors). MOSFETs are capable of switching frequencies in the MHz range and are simple to control. However, MOSFETs are subject to higher resistive losses for comparable maximum current for each device. Such losses, however, can be controlled with efficient thermal management that provides low operating junction temperatures.

Conventional converter construction and operation does not lend itself to high switching frequencies, e.g., >10 kHz operation, without high losses. Additionally, conventional converter construction does not lend itself well to the parallel operation of power MOSFETs at high switching frequencies, due to the mutual interaction or cross-talk, between the parallel devices. The need exists for circuit designs and constructs that provide for the efficient paralleled operation of multiple devices at high currents and high signal frequencies.

SUMMARY OF THE INVENTION

The present invention provides for the substantial elimination of the generally performance degrading mutual interaction of paralleled devices in power output driver circuits employing high signal frequencies and/or high currents.

The present invention provides for the construction and operation or high frequency, high power converters.

The present invention provides for the construction and operation of high efficiency converters.

The present invention provides for the low cost construction of the output drivers for compact, high efficiency, and high frequency converters.

BRIEF DESCRIPTION OF THE DRAWINGS

The present invention is hereinafter described in conjunction with the appended drawing or figures, wherein like designations denote like elements, and.

DETAILED DESCRIPTION OF A PREFERRED EXEMPLARY EMBODIMENT

Figure 1:
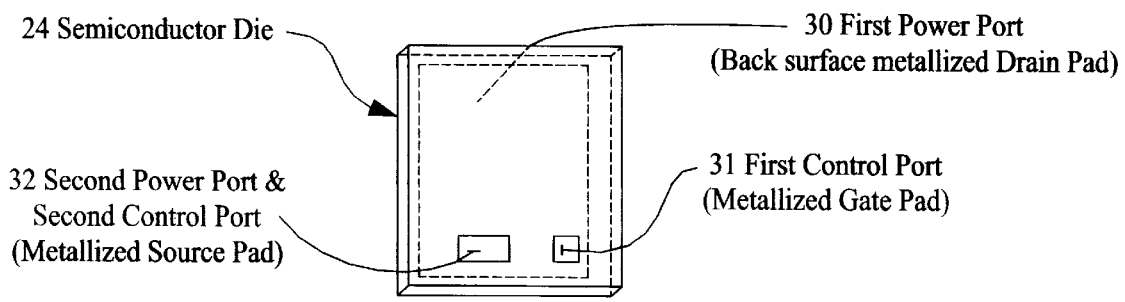
FIG. 1 is a semi-conductor die illustrating points of connection.

The geometric arrangement and topologies described herein are particularly beneficial in circuits employing multiple paralleled devices for high power output at high frequencies, for example greater than 10 kHz. Considerable advantage is obtained using the present invention in the construction and operation of a class or circuitry known in the art as powers converters. Power converters are generally understood to include, inter alia, AC-to-AC and DC-to-DC, converters, as well as AC to DC converters (sometimes called rectifiers) and DC and AC converters (sometimes called inverters). Those skilled in the art will also appreciate that the term power converts also includes power amplifiers of the A, AB, B, C, and D types and their various subtypes.

The present invention specifically addresses the power output driver stages of the aforementioned converters and amplifiers, and such other power circuit designs that employ high current outputs (as defined herein). The terms converter, amplifier or other power circuit are used herein to refer specifically to the power output driver state of the converter, amplifiers, or other power circuit design. Power output drivers configured in accordance with the present invention are generally characterized by electrically and mechanically symmetric construction and a minimization of output impedance, such that intrinsic device properties, rather than the cumulative adverse device interactions among the devices, determine converter output performance. In accordance with one aspect of the invention, this means that the voltage due to the inductance, capacitance, and resistance in a device path are substantially equal and substantially minimized for each device.

An exemplary converter in accordance with the present invention suitably comprises one or more high current output stages typically operated at a total output power in the range of at least one KW and employs a switching frequency in the range of least 10 kHz. The individual power output driver stage contains at least one voltage output stage. The voltage output stage consists of at least one power control unit. Multiple power control units may be seriesed for high output voltage or paralleled to increase current output, or multiple power control units may be configured in a combined series-parallel construction for a high voltage and high current power output driver. Voltage output stages may be configured as a single power output driver stage, two voltage output stages for a half bridge power output driver structure, or four voltage output stages may be employed for polyphase operation, e.g., three half bridges for three phase circuits, that is, one half bridge for each leg of the circuit.

A power control unit suitably comprises a substrate of high electrical and thermal conductivity, e.g., a metal such as copper, copper alloys, aluminum, molybdenum, tungsten etc., upon which are mounted, in an electrically and thermally conductive manner, multiple paralleled power devices with their associated cluster driver placed in close proximity on electrically insulated mountings. Inside and outside corners of all surfaces subject to high sheet currents are desirably radiused to reduce reflections due to high frequency components of AC signals. The electrically and thermally conductive substrate is both a circuit element (e.g., a conductive substrate) and a heat sink which may be cooled by gas, liquid, or vapor. The devices are advantageously disposed on the substrate in an electrically symmetrical manner. As discussed in greater detail below, cooling of the substrate may be accomplished with a suitable fluid such as liquid, gas or vapor.

For illustration purposes the present invention is described in the context of power MOSFETs and associated terminology. However, any device having functionality comparable to MOSFETs can be utilized in the same fashion. Moreover, the present invention is not restricted to three terminal devices; it may be generalized to devices with four or more terminals. The terms semiconductor and/or device, die, and chip, whether in the context of a packaged chip or bare die, are treated as functionally equivalent in the context of the present invention and, hence, are used interchangeably. "High" currents, as used herein, generally means those currents which when applied to electrically asymmetrical paralleled devices cause unequal current sharing between devices as a result of the asymmetry.

Electrical symmetry is herein defined for multiple paralleled devices in a circuit such that between individual devices and the output terminal, each device has substantially the same output impedance as every other device, such that each device carries substantially the same current (i.e., there is uniform current sharing among the devices). Because of this symmetry, the gate drive signals applied to the parallel devices may be advantageously substantially uniform in timing and amplitude. Such electrical symmetry results in a dramatic reduction in cross coupling among the devices.

The maximum current a given device can conduct when operating at its maximum power point on the upper edge of its SOAR (Safe Operating Area) curve, defines the performance limits of a given device. When multiple devices are paralleled in a circuit to increase the output current of that circuit, the individual paralleled devices typically cannot be simultaneously operated near their maximum current; that is, the devices are appreciably derated, and the circuit current is electrically asymmetrical. A possible test for measuring the extent of electrical symmetry in a circuit incorporating multiple paralleled devices is to operate the least conductive device along the upper edge of its SOAR curve to its maximum power point which is defined when the junction temperature ($T_j$) of the device reaches the maximum specified for the device. If the other paralleled devices exceed the manufacturer's specification for $T_j$, and/or current, the circuit is asymmetrical. If all devices have substantially identical $T_j$ and I (current) conduction, the circuit is symmetrical.

Preferred embodiments of electrically symmetrical circuit topologies as described herein are characterized by current flow, from the paralleled power semiconductors on the clusters being generally orthogonal, on average, to a line joining the centers of the paralleled power semiconductors; consequently, the current flowing away from each semiconductor travels in such manner as to minimize the effect on the performance characteristics of any of the other semiconductors. Construction of the power control units is such that the current flow from any of the paralleled devices does not cross or merge, in any substantial manner, with the current flow from any of the other paralleled devices on a power control unit. More precisely stated, Div I $\simeq$ 0 and $I_j$ dot $I_{j+k} \simeq 0$, where I is the total current through the power control unit, and $I_j$ is equal to the current through device j, with j ranging from 1 to n, k ranging from 1 to n, but k cannot equal j, and n is the number of paralleled power devices on a power control unit.

Figure 23:
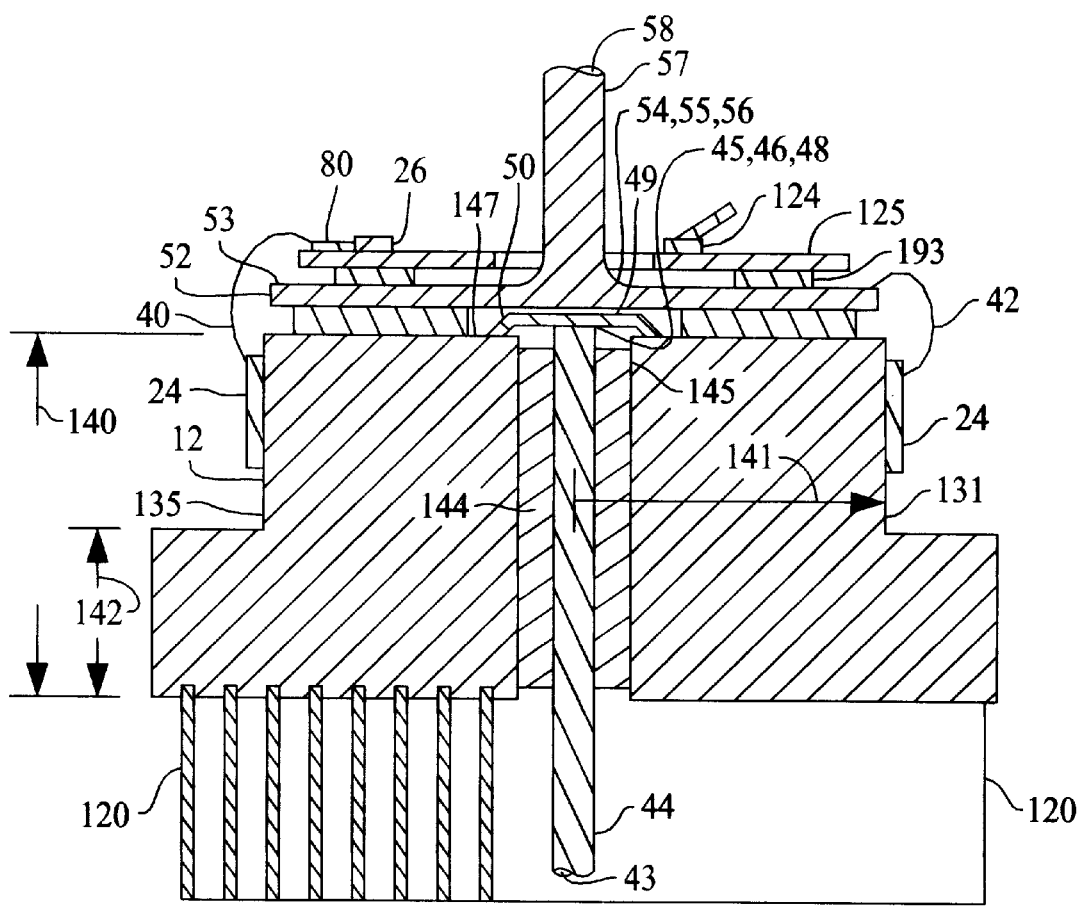
FIG. 23 is a cross section view of FIG. 22 through section A.

As explained in greater detail below, the circuit arrangements of the present invention are configured to transform a source of current at the input into an extended and uniform sheet current which is applied to and high frequency modulated or controlled by the multiple paralleled power devices, whereupon the current is again transformed into a "point" source of current at the output. The parallel current flow from any device, in accordance with the present invention, does not merge or cross the path of the current flow of any other device on a cluster in any substantial manner, thereby minimizing any adverse mutual device cross coupling among the paralleled devices. Thus, high frequency and related losses of the modulating and output signals are determined by the intrinsic properties of the devices, rather than by adverse mutual device cross coupling as in the prior art. FIG. 23 best illustrates this point-to-point transition from input to output in the context of the present invention.

In order to facilitate the uniform distribution of current to the various paralleled devices, it is desirable to control the electrical characteristics of the current path for the devices such that, inter alia, each device "sees" substantially the same impedance and the respective voltage drops across each device are substantially equal. In this regard, the voltages developed in a device path (V) for each device may be expressed as $V=V_L+V_C+V_R$, where I is the device current; $V_C$=C I dt, where C is the path capacitance; $V_L$=L dI/dt where dI/dt is the time rate of change of the current and L is the path inductance; and $V_R$=IR, where R the effective resistance due to the skin effect of the conductors.

Substantially identical device impedance permits the driving signals to all devices on a substrate to be substantially uniform in timing and magnitude. This ensures that the converter turn on and turn off time is substantially uniform and is substantially determined by the intrinsic characteristics of a device and not degraded by the cumulative interaction of the multiple paralleled devices on the substrate.

FIGS. 1 to 14 are diagrammatic illustrations of the principles of construction of the present invention, and are shown in the embodiments described herein.

Figure 15:
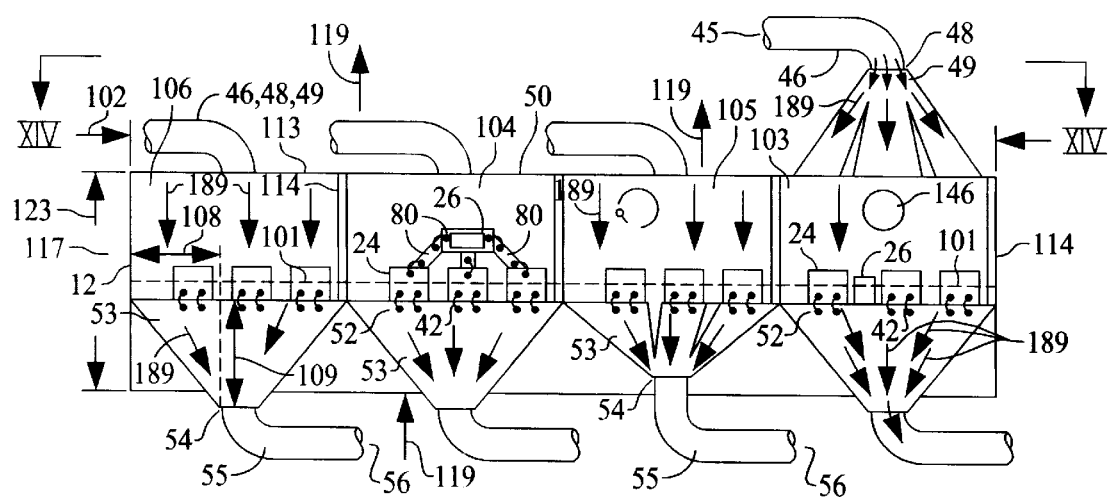
FIG. 15 is a top view of a linear air cooled power control unit, employing a single row of devices, in accordance with the present invention.
Figure 17:
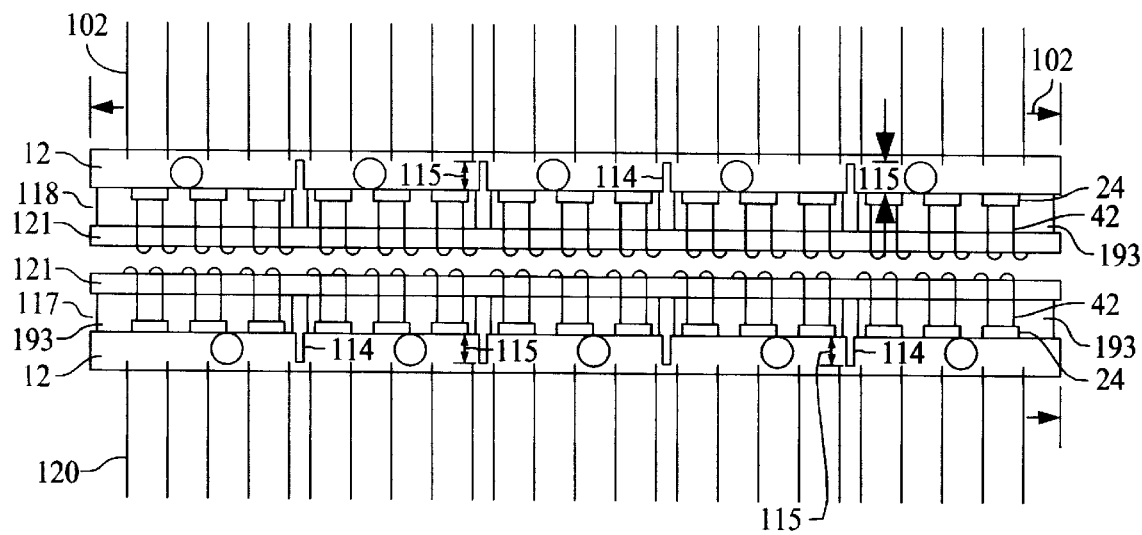
FIG. 17 is an extended rear end view taken along line XIV of the linear air power control unit of FIG. 8, augmented with a second, opposing power control unit.
Figure 18:
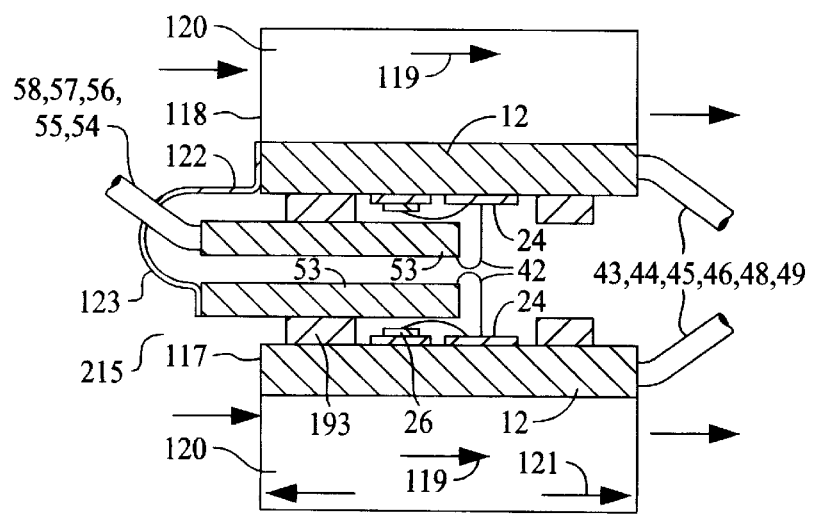
FIG. 18 is a cross section view of two interconnected linear air cooled power control units of FIG. 10.
Figure 33:
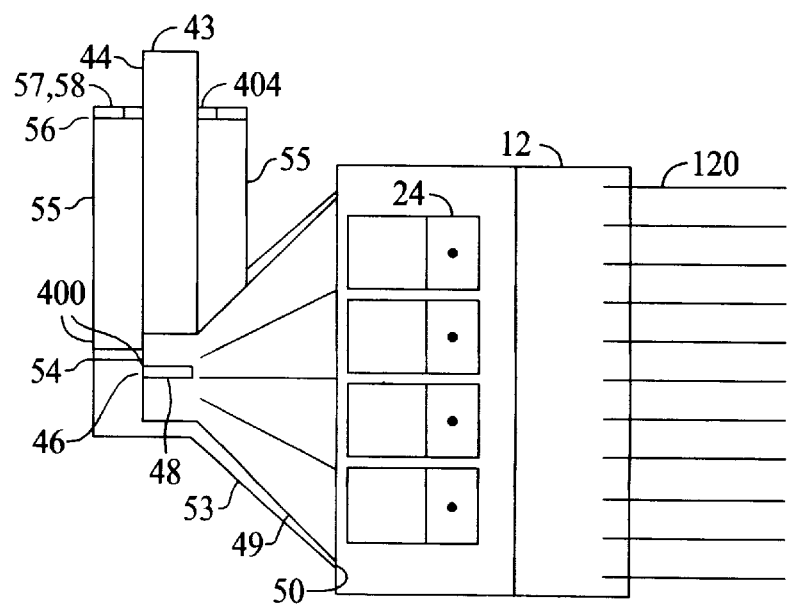
FIG. 33 is a side view of FIG. 31 with removal of selected elements for illustration purposes.

The present invention may, for example, be configured in; a coaxial configuration as shown in the embodiments of FIGS. 21, 22, 24, 34; a micro-strip configuration as shown in the embodiments of FIG. 15; a stripline configuration as shown in the embodiments of FIGS. 17, 18; or a folded back configuration as shown in the embodiments of FIGS. 33.

Figure 2:
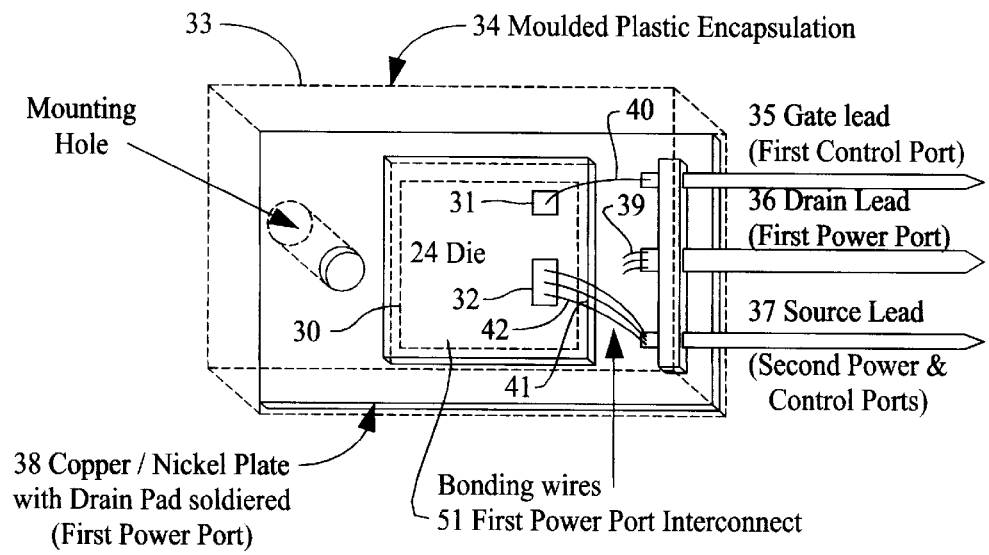
FIG. 2 is a packaged semi-conductor die illustrating the various connections.

Referring now to FIGS. 1 and 2, shown are semi-conductor devices 24, sometimes called a die or chip and a packaged semi-conductor die 33. Die 24 includes a first control port 31 which is the metalized gate pad, a combined second power port and second control port 32, which is the metalized source pad, a first power port 30 comprising the back metalized surface of die 24. The terminology of a drain, source and gate are that used to describe a MOSFET semiconductor which is a three terminal device. In a four terminal device, the second power port and the second control port would comprise separate ports. When employing other devices, other appropriate terminology would be used.

Referring now to FIG. 2, shown is a packaged die 33 composed of molded plastic or hermetic ceramic or metallic housing 34 encapsulating die 24. Die 24 is electrically and mechanically bonded 51 (first power port interconnect) to the metalized drain pad 30 by solder, conductive adhesive or other suitable means to a thermally and electrically conducted plate 38 e.g. plated copper, plated beryllia etc. Gate lead 35 is attached to die 24 gate pad 31 by gate bonding wire 40 (first control port interconnect). Source lead 37 is bonded to source pad 32 by bonding wires 41, 42 (second control and power port interconnects). Drain lead 36 is bonded to conductive plate 38 by bonding wires 39. When die 24 is packaged (34), the gate lead 35 extends the gate pad 31 (the first control port) to external circuitry. The source lead 37 extends the source pad 32 (the second power and control port) to external circuitry. The first power port 30 is connected to external circuitry through either conductive plate 38 or drain lead 36 which is connected by bonding wires 39 to conductive plate 38. Drain lead 36 has higher inductance than plate 38. In general the lead inductance of packaged devices is higher than that for wire bonded die or chips.

Figure 3:
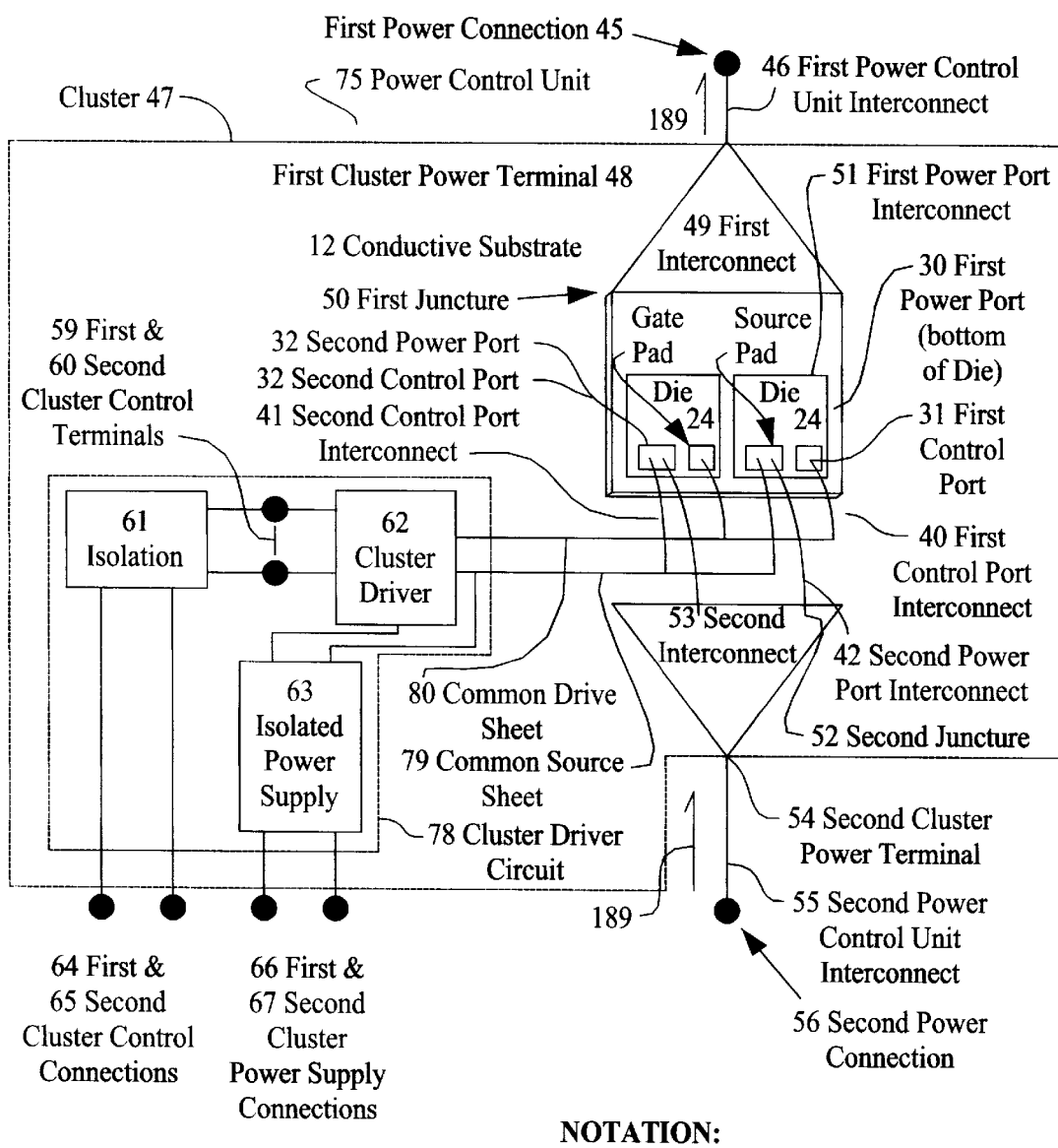
FIG. 3 is a diagrammatic illustration of the present invention illustrating the various components of construction of the basic power control unit.
Figure 5:
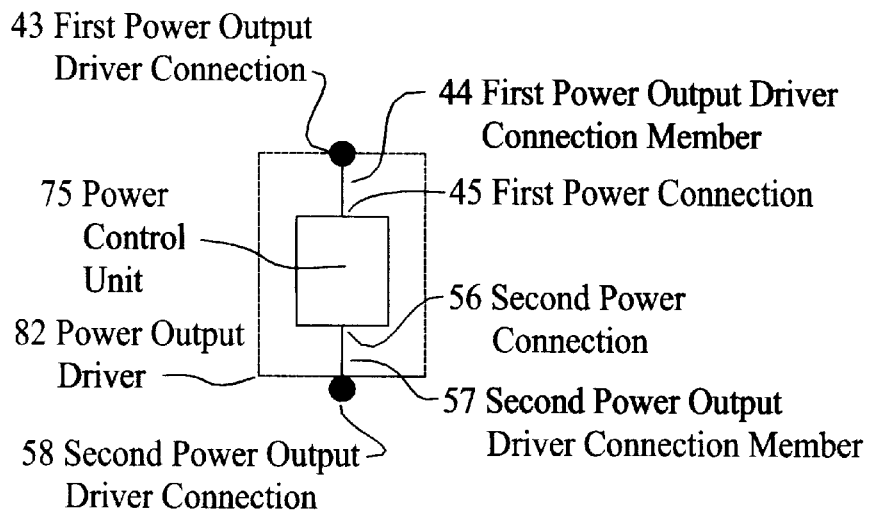
FIG. 5 is a basic power control unit with power output driver connections.

Referring now to FIGS. 3 and 5, shown is a generalized diagram of the present invention illustrating and naming the various component parts from which the embodiments described herein are constructed. The first power output driver connection 43 comprises the common terminus for multiple power control units, which in turn may be comprised of multiple paralleled clusters 47 and may, for example, be connected to the input power source 74 depending on the specific circuit configuration. Power control units may be paralleled for higher current capacities or seriesed for high voltages as shown in FIGS. 6, 7, 8, 9, 10.

The first power output driver connection member 44 interconnects the first power output driver connection 43 to the first power connection 45. The first power connection 45 may serve as the connection point for multiple paralleled clusters 47, or it may serve as a power output driver connection for a single power control unit 75. The first power control unit interconnect 46 interconnects the first power connection 45 and the first cluster power terminal 48. The first cluster power terminal 48 provides the power connection to cluster 47.

Cluster 47 is the basic power block (FIGS. 3, 5) of the present invention and is incorporated in all embodiments described herein. Clusters are paralleled (FIG. 4) to provide higher current capacity power control units. The power control units can be paralleled and/or seriesed (FIGS. 6, 7, 8) in any combination to provide higher current and/or voltage power output drivers. The second power connection to cluster 47 is provided by the second cluster power terminal 54. Second power control unit interconnect 55 interconnects the second cluster power terminal 54 and the second power connection 56. When paralleling multiple power control units, a second power output drive connection member 57 interconnects the second power connection 56 to the second power output driver connection 58 which is the common terminus for the power control units and to which a suitable load, such as a motor drive, may be connected.

Cluster 47 shown enclosed within dotted outline (FIG. 3) may, for example, comprise a first interconnect 49 having a first juncture 50, or connection, to conductive substrate 12 upon which die 24 are mounted. Die 24 have a first power port 30 comprising the bottom of die 24 which is connected by first power port interconnect 51, which may be by soldering or a conductive adhesive, to conductive substrate 12. Source pad 33 comprising the second power port 32, on die 24 is connected at a second juncture to a second interconnect 53 by second power port interconnect 42. Second control port interconnect 41 connects second power port 32 via common source sheet 79 to a second side of cluster driver 26 and to one side of the isolated power supply 63. The first control port 31, at gate pad 31 is connected to the first side of the cluster driver 26 by first control port interconnect 40 via common drive sheet 80. First 64 and second 65 cluster control connections are connected to isolation means 61. Isolation 61 is connected to cluster driver 26 through first 59 and second 60 cluster control terminals. Isolation 61 may be external to power control unit 75. First and second cluster power connection supply 66, 67 are connected to isolated power supply 63. Isolated power supply 63 has one side connected to cluster driver 62 and the second to the second side of the cluster driver 62 and the common source sheet 79.

Figure 4:
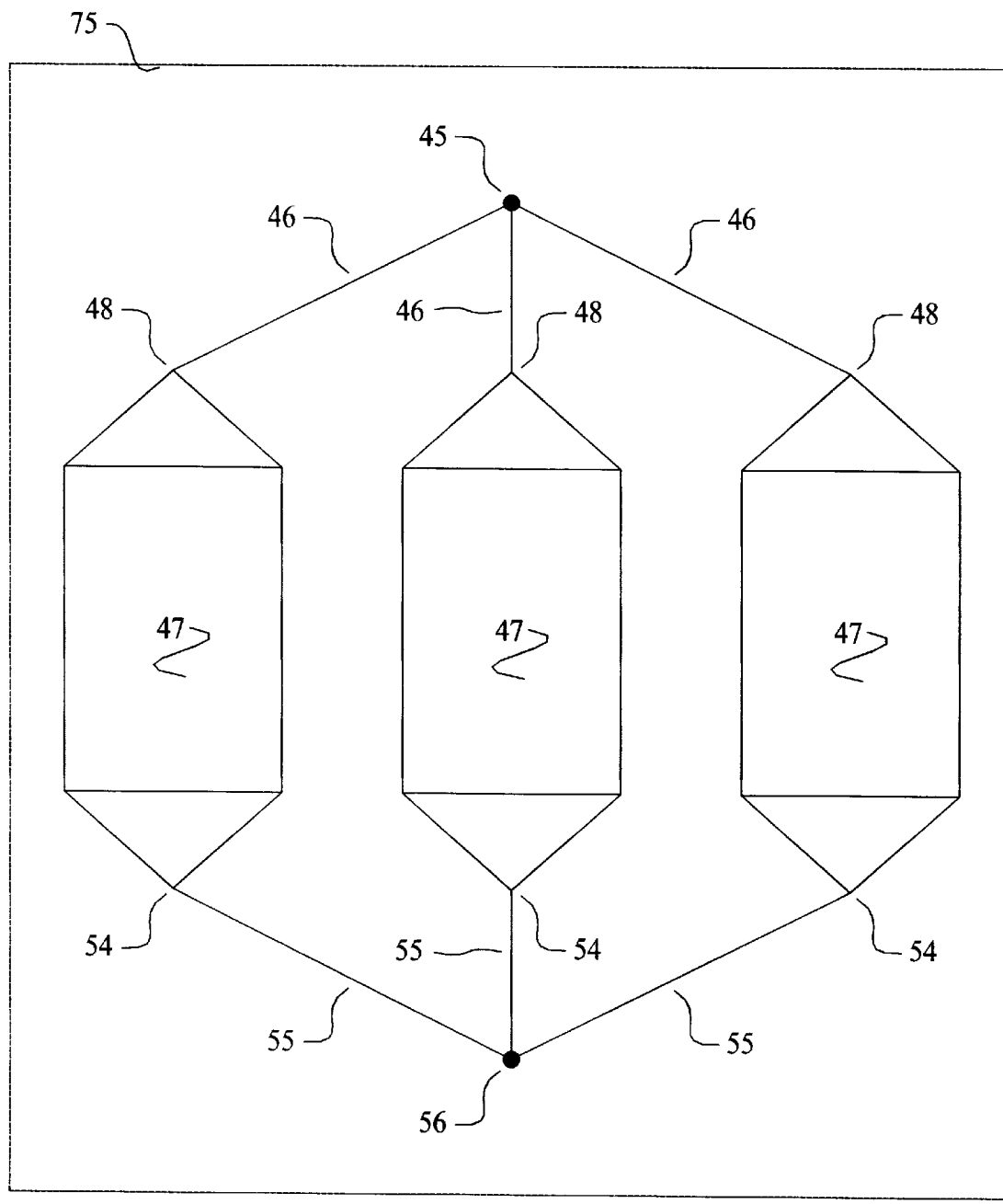
FIG. 4 is a power control unit comprising multiple paralleled clusters.
Figure 6:
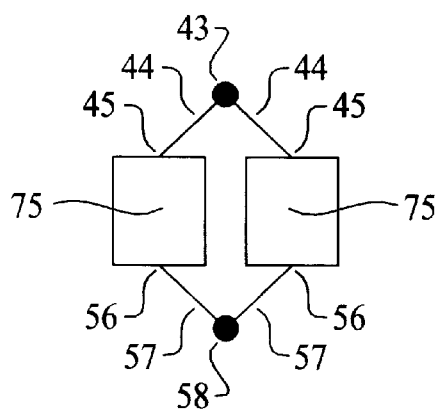
FIG. 6 illustrates the connections used to parallel power control units.
Figure 7:
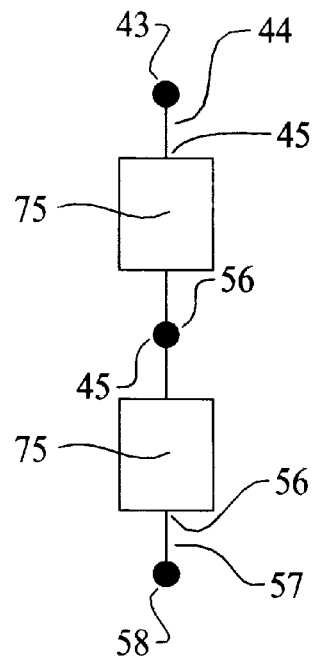
FIG. 7 illustrates the connections used to series connect power control units.
Figure 8:
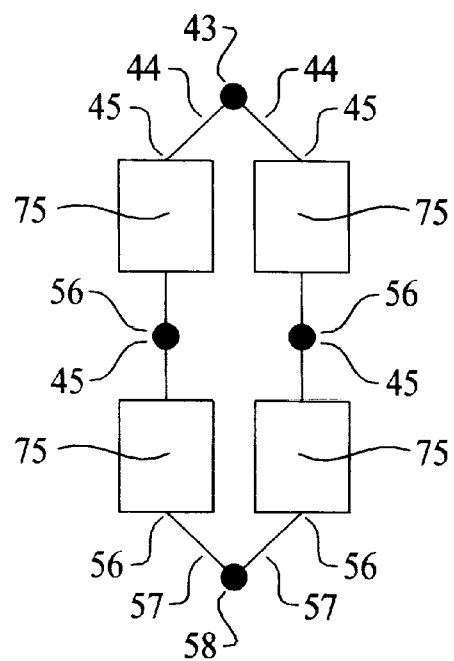
FIG. 8 illustrates the connections used to interconnect series-paralleled power control units.

Referring now to FIG. 5, shown is a single power control unit 75, as in FIG. 3 or 4, with first power output driver connection 43 and a second power output driver connection 58 to be attached to an input power source and a suitable load, such as a motor drive. Referring now to FIG. 6, shown are two power control units 75 of FIG. 3 or 4 connected in parallel with first 43 and second 58 power output drive connections to be connected to an output power source and a suitable load. Connections are merged to a single element, that is, at the first power control unit interconnect 46 terminus the first power connection 45, first power output connection member 44 and first power output driver connection 43 merge into a common connection which serves as the first power output driver connection 43. In like manner, second connections 56, 57, and 58 merge at the terminus of 55 to form common connection 58. In other embodiments, as illustrated herein, different numbers of connections may merge dependent on geometry. In particular embodiments, the merged connections are designated by the grouping of the particular number designations as shown in FIG. 23 where 43, 44, 45, and 56, 57, 58 merge to form respectively common first 43 and second 56 power output driver connections. Referring now to FIG. 7, shown are two power control units 75 connected in series for an increased voltage handling capacity. Referring now to FIG. 8, shown are the power control units of FIG. 3 in a series-parallel configuration for increased current and voltage handling capacity. The different geometry's employed in the various embodiments, such as linear and circular constructions of the present invention may have devices mounted on a substrate surface or on its periphery, which results in a large number of potential configurations.

What has been shown in FIG. 3 are the various elements of construction in the form of interconnects, connections etc. from which any particular embodiment is constructed. Shown in FIGS. 5, 6, 7, and 8 are the various combinations of series, parallel and series-parallel configurations of power control units of FIGS. 3, 4. Depending on the geometry of the embodiment, two or more connections may merge to form a common connection.

Figure 28:
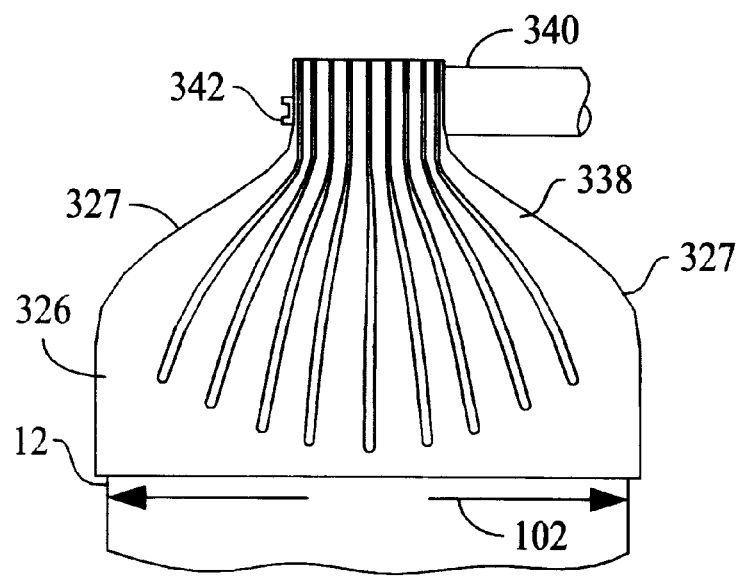
FIG. 28 is multiple slotted and insulated sheet first or second power control unit interconnect flexed and twisted to join at a first or second cluster power terminal.

By definition, connections to a load and input power source are made by the first 43 and second 58 power output driver connections. Thus, when a power control unit 75 comprises a single cluster 47 and is to be connected to a load and power source as shown in FIG. 28, in general, the minimum number of connections are required. In this example connections are merged to a single element, that is, at the first power control unit interconnect 46 terminus the first power connection 45, first power output connection number 44 and first power output drive connection 43 merge into a common connection which serves as the first power output driver connection 43. In like manner, second connections 56, 57, and 58 merge at the terminus of 55 to form common connection 58. In other embodiments, as illustrated herein, different numbers of connections may merge dependent on geometry. In particular embodiments, the merged connections are designated by the grouping of the particular number designations as shown in FIG. 28 where 43, 44, 45, and 56, 57, 58 merge to form respectively common first and second power output driver connections.

Figure 9:
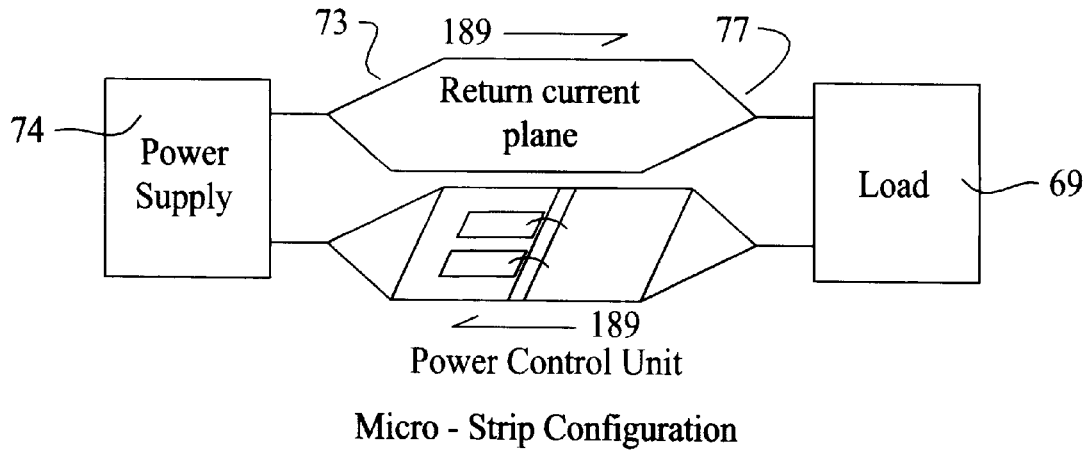
FIG. 9 illustrates diagrammatically the present invention in a micro-strip configuration.
Figure 10:
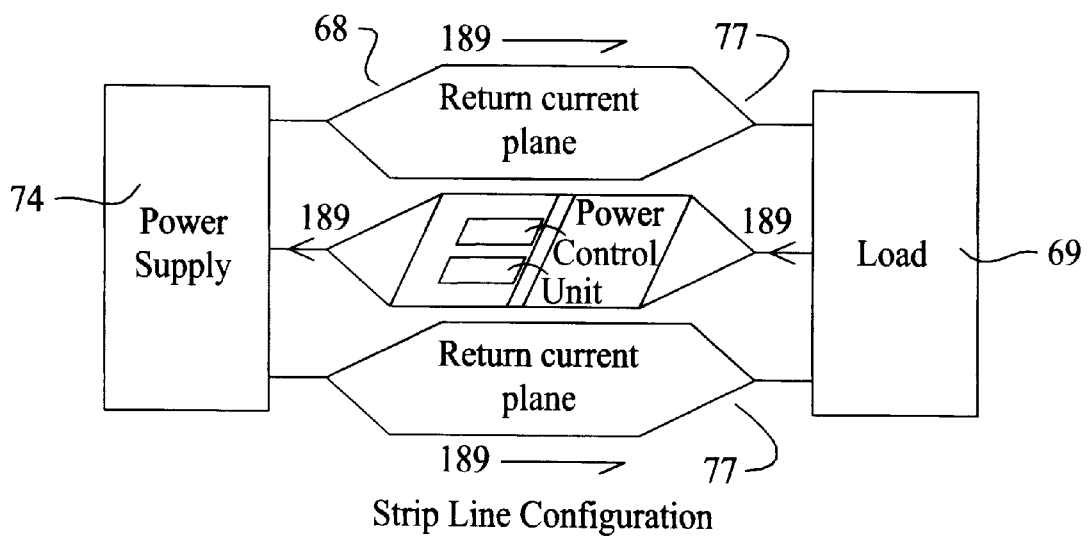
FIG. 10 illustrates diagrammatically the present invention in a strip line configuration.

Referring now to FIGS. 11–14, shown for clarity are diagrammatic illustrations of the various exemplified embodiments of the present invention. Referring now to FIG. 9, shown is the power control unit of FIG. 3 in a micro-strip configuration. The circuit 73 meets the requirement for uniform and minimized impedance for both single and multiple power control unit 75 construction with the return current path in the form of a plane in close proximity to power control unit 75 to meet minimum impedance criteria. Micro-strip construction is exemplified in FIG. 15. Referring now to FIG. 10, shown is the present invention in a strip line configuration. The circuit 68 meets the requirement for uniform and minimized impedance for both single and multiple power control unit 75 construction with the return current paths in the form of opposing planes in close proximity to power control unit 75 to meet minimum impedance criteria. Strip line construction is exemplified in FIGS. 17, 18.

Figure 11:
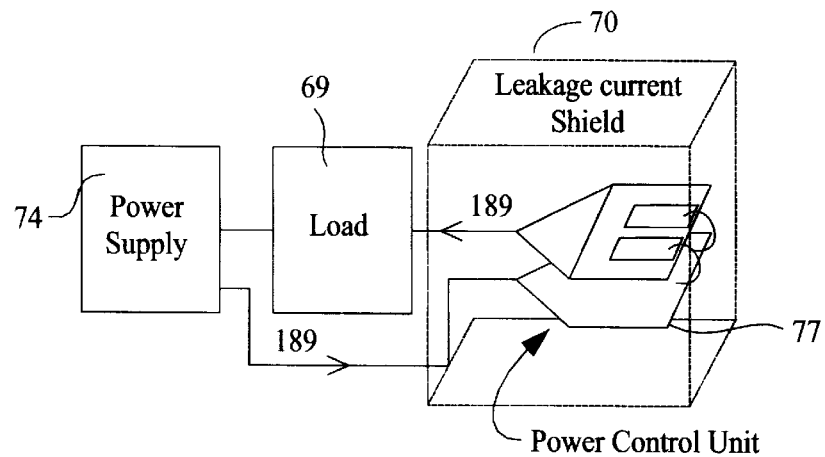
FIG. 11 illustrates diagrammatically the present invention in a folded black configuration.

Referring now to FIG. 11, circuit 70 shows the present invention with power control unit 75 in a folded back configuration with the folded segments of 49, 51 and 53 in close proximity to each other to minimize impedance. Folded back construction is exemplified in FIG. 33.

Figure 12:
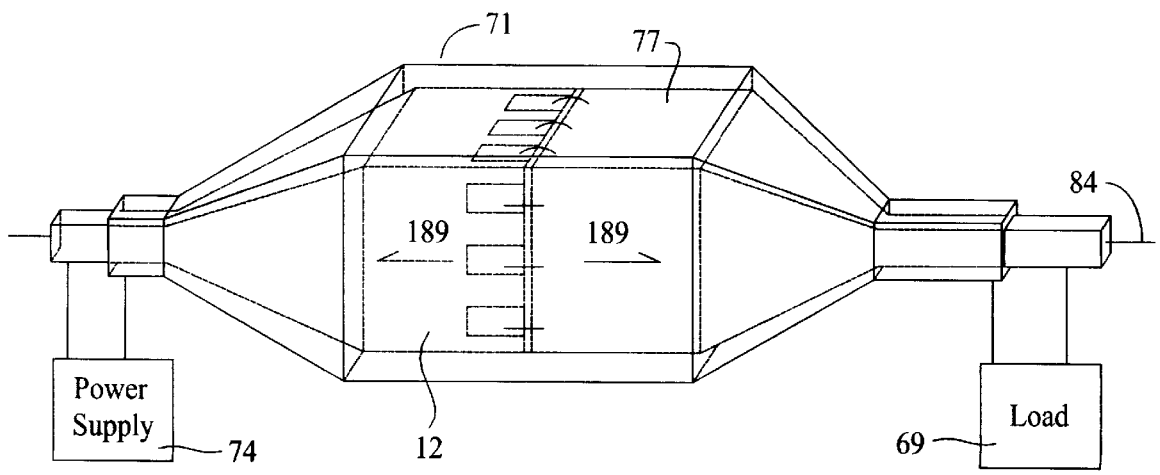
FIG. 12 illustrates diagrammatically the present invention in a coaxial, axially symmetric configuration.

Referring now to FIG. 12, shown is the present invention in circuit 71, configured in a co-axial (axillary symmetric) geometry. To meet minimized impedance requirements, the return current sheathe girdles power control unit 75 and is in close proximity to them. Co-axial construction is exemplified in FIGS. 21, 22, 24, 34.

Figure 13:
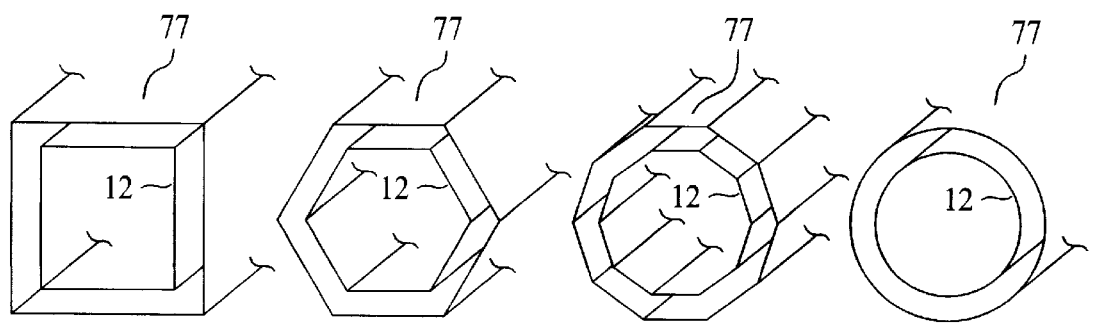
FIG. 13 illustrates various coaxial, axially symmetric flat configurations for mounting multiple devices in power control units.

Referring now to FIG. 13, shown are various co-axial geometry's of conductive substrate 12, with appropriate return current sheathes, that may be employed in the present invention. Starting with four isolated sides, each side preferably having devices mounted thereon and separated except at the output driver connections 43, 58, as described in FIG. 3, a six and then ten sided substrate 12, with corresponding sheathes, are next shown. As a limiting design, substrate 12 progresses to a circular configuration i.e. an infinite number of sides.

Figure 14:
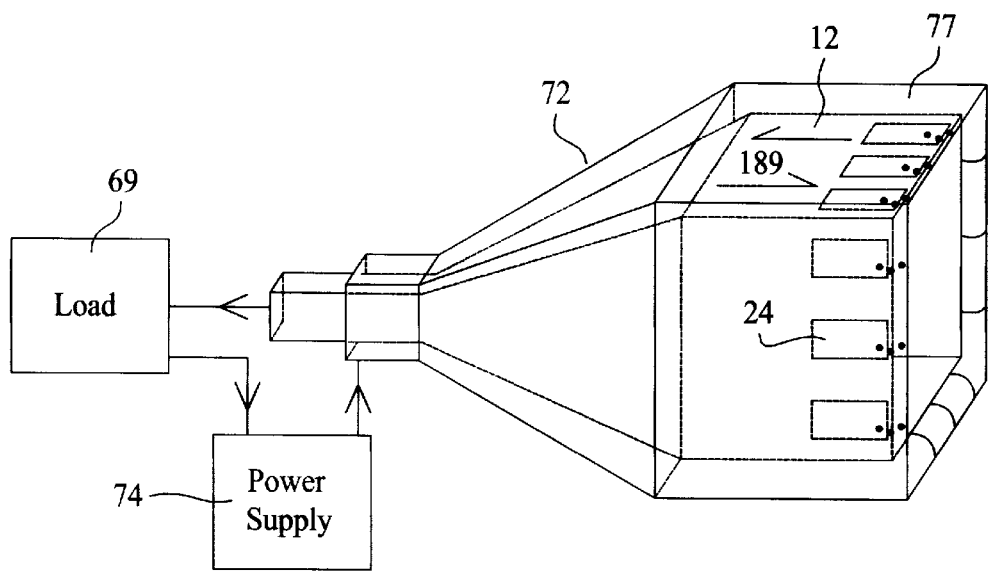
FIG. 14 illustrates diagrammatically the present invention in a folded coaxial, axially symmetric configuration.

Referring now to FIG. 14, shown is the present invention in circuit 72 in a combined co-axial and folded back configuration with the return current sheathe girdling and in close proximity to substrate 51 for minimized impedance.

To minimize circuit impedance the return current path i.e. ground/neutral return should preferably be a sheet conductor e.g. copper, as it inherently minimizes inductance by virtue of field cancellation by providing a known proximal current image plane, as is well known to those skilled in flie aft. By not providing a proximal image current plane, a circular wire used as ground/neutral current return constitutes a high impedance path by virtue of the large stored energy in space due to the lack of field cancellation.

Referring now to FIG. 15, an embodiment of voltage output stage 100 is configured as a linear electrically symmetrical air cooled voltage output stage comprising conductive substrate 12, for example a copper plate upon which are mounted devices 24 in a manner such that the centers of devices 24 are disposed proximate to a line 101. Line 101 is preferably parallel to the axial length 102 of conductive substrate 12. Respective second interconnects 53 may be made of multiple conductive insulated layered sheets. Cluster driver 26 and common drive sheets 80 are suitably configured function in substantially the same manner as described in connection with FIG. 21 as shown in cluster 104. In the exemplary embodiment shown in FIG. 15, conductive substrate 12 is suitably divided into a plurality of clusters (e.g., four), for example respective clusters 103, 104, 105 and 106. Each cluster here comprises three devices 24 driven by a cluster driver 26. In cluster 104 cluster driver 26 is on the other side of the line 101 of devices 24. If cluster driver 26 only drives two devices 24, it may be "suitably placed between the two devices 24 as shown in cluster 103 for minimal lead inductance. Alternatively, individual. cluster driver 26 boards 125 as described in connection with FIG. 21 may be employed for clusters, 103, 104, 105 and 106.

Figure 16:
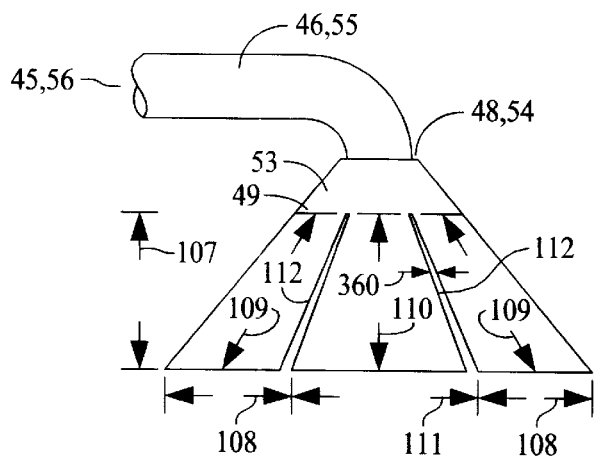
FIG. 16 is an exemplary tapered slotted first or second interconnect.

Continuing with FIG. 15. second interconnects 53 are smoothly tapered to receive a second power control unit interconnect 55, e.g., Litz wire. To maintain electrical symmetry, length 107 of second interconnect 53 is suitably at least equal to twice the width 108, and preferably at least about 1.5 to 2 times larger, to minimize reflections. To reduce the size of second interconnect 53, it may be slit as shown in second interconnect 53 (FIGS. 15, 16). Though second interconnect 53 (FIGS. 15, 16) is shown slit in two places providing three legs, more slits may be employed. These same design considerations may also be applied to the three legs of second interconnect 53 (FIG. 16), that is, the lengths 109, 110 are suitably at least 1.5 to 2 times larger than widths 108 and 111 respectively. The impedance of the three legs should be substantially equal. Legs 109 on enter side of leg 110 are desirably of the same dimensions. Leg 110 is shorter than legs 109 and therefore the width 111 of leg 110 should be appropriately less than width 108 of legs 109 to obtain equal impedance in all three legs. This design criteria also applies to tapered first interconnect 49. The current carrying capabilities of the first and second power control unit interconnects 53, and may be further enhanced by fabricating them as multiple slotted and insulated interconnects of FIGS. 26 and 27. In general, metal thickness should be at least twice the skin current depth for all conductors described herein. The width of slot 112 may range from 0.1 to 10 times that of the thickness of interconnects 49 and 53. First 49 and second 53 interconnects are shown connected to first and second power control unit interconnects which may, for example, by Litz wire. To simplify and improve reproducibility, the first and second interconnects and the first and second power control unit interconnects may be fabricated as a single piece by, for example, photo chemical machining or chemical milling. Thus, the first and second power control unit interconnects would be of the same metal sheet stock e.g. copper, as the first and second interconnects and be of suitable width, length and geometry, and which may include curved segments, to provide for common interconnect at their terminus, while maintaining predetermined, preferably uniform impedance characteristics.

With continued reference to FIG. 15, respective multiple first power control unit interconnects 46, 48, 49 (e.g., Litz wire) are attached periodically along the side 113 of conductive substrate 12 substantially parallel to line 101 joining centers of device 24 to facilitate uniform input current distribution to conductive substrate 12. To assist in confining current flow 189, slots 144 of narrow width, e.g., 0.3 mm, and a suitable depth 115 (FIG. 17) of about 10% to 80% that of the thickness of conductive substrate 12 are placed approximately midway between first power control unit interconnects 46, 48, 49 and extend 116 (FIG. 15) slightly beyond devices 24. Slots 114 also serve to provide partial high frequency isolation of adjacent clusters 103, 104, 105 and 106. Slots 114 may be advantageously employed in all embodiments, including radial slots for circular symmetric configurations. Alternatively, first interconnects 49 may be employed to provide uniform current distribution across conductive substrate 12. Surge protection devices 146 such as MOVs or diodes may be mounted on conductive substrates 12 in close proximity to devices 24 and second interconnects 53.

Referring now to FIG. 17, element 117 of FIG. 15 is shown rotated 90° about line 101 (top of FIG. 15 rotated toward the reader); an additional, complimentary element 118 is also shown disposed opposite element 117. If desired, power control units 117, 118 may be seriesed to double the operating output voltage or connected as a single phase power output driver, or paralleled to double the current output. When operating in a series single ended configuration, i.e., either positively or negatively biased as a voltage output stage with another similar oppositely biased voltage output stage, it may be employed to provide single phase output. Parallel operation (FIG. 18) requires that both second interconnects 53 of power control units 117 and 118 are tied together by interconnect 122, and that the first power control unit interconnects 49 on power control units 117, 118 are also tied together. For three phase output, three power output drivers 100, operating 120° out of phase with each other would be employed.

Respective power control units 117, 118 (FIGS. 17, 18) are advantageously positioned with fins 120 of element 117 extending upwardly and fins 120 of element 118 extending downwardly, and with devices 24 facing each other. This construction allows for the convenient, low impedance interconnection of power control units 117 and 118 for series or parallel connections by providing a short conductive bridge interconnecting power control units 117 and 118, as described below in connection with FIG. 18. Streamlined shrouding, not shown, may be positioned to cover the area between conductive substrates 12 including devices 24 and second interconnects 53 of power control units 117, 118. This then directs substantially all the air flow 119, for example from a fan used to cool the apparatus to fins 120 on power control units 117, 118. The shroud may be provided with suitable apertures to allow predetermined air flow for any required cooling of second interconnects 53 in the shroud covered region. Air flow 119 is generally parallel to fins 120 and conductive substrates 12.

To effect series connection of power control units 117, 118 (FIG. 18), respective, the first power control unit interconnects 46 of power control unit 118 and the second power control unit interconnects 55 of power control unit 117 are unitized 122 and comprise a merging of connections 45, 56. Second interconnect 53 is advantageously of rectangular shape for a simpler and a more efficient interconnecting configuration. In accordance with one aspect of the illustrated embodiment, unitized connection 122 may include a series of voids or slots 123 which provide clearance for second power control unit interconnects 55. Clearance slots 123 are provided for each of second power control unit interconnects 55. Unitized connection 122 suitably comprises an elongated, curved sheet of thin metal, e.g., 0.5 mm copper, that extends substantially the length 102 of conductive substrate 12.

For use as a power output driver, i.e., single phase AC output, first power control unit interconnect 49, 48, 46, 45, 44, 43 of power control unit 117 is biased positive and second power control unit interconnects 58, 57, 56, 55 of power control unit 118 are biased negative. Respective, the first power control unit Interconnects 49, 48, 46, 45, 44, 43 of power control unit 118 and the, second power control unit interconnects 58, 57, 56, 55 of power control unit 117 are tied together and comprise a merging of connections 45, 56, which may be used as a power output driver connection. To maintain uniform impedance, the wire length of all first power control unit interconnects are suitably equal, and in like manner the wire length of all second power control unit interconnects are also suitably equal. Appropriate driver output control signals are alternately applied to the power control units 117, 118 to provide an AC output.

Alternatively, one power control unit, e.g. element 118, may be rotated 180° such that conductive substrate 12 input interconnect 46 are now on opposing sides, whereby a counter flow current is established which minimizes inductance. In this configuration unitized connection 122 does not require clearance slot 123 since second power control unit interconnect 55 is now on the opposing side and is not obstructed as previously with unitized connection 122.

Referring again to FIG. 15 and cluster 103, current 189 flow from first power control unit interconnect 46 across first interconnect 49 and conductive substrate 12, through devices 24 and across second interconnects 53 is seen to be generally orthogonal, on average, to line 101 joining centers of devices 24 thus providing uniform impedance between devices 24 and second power control unit interconnects 55. The configurations illustrated in FIGS. 15, 17, 18 thus meet the criteria for electrical symmetry: the current flow 189 from any of the paralleled devices 24 does not cross or merge, in any substantial manner, with the current flow from any of the other paralleled devices prior to converging at the first and second cluster power terminal where the current convergence or divergence is controlled and predetermined. All current paths, being substantially identical, have substantially equal impedance and therefor, each device 24 sees the same impedance. The electrical symmetry resulting from the above-described configuration ensures minimum device cross coupling and substantially uniform current sharing for maximum efficiency and operating frequency.

Figure 19:
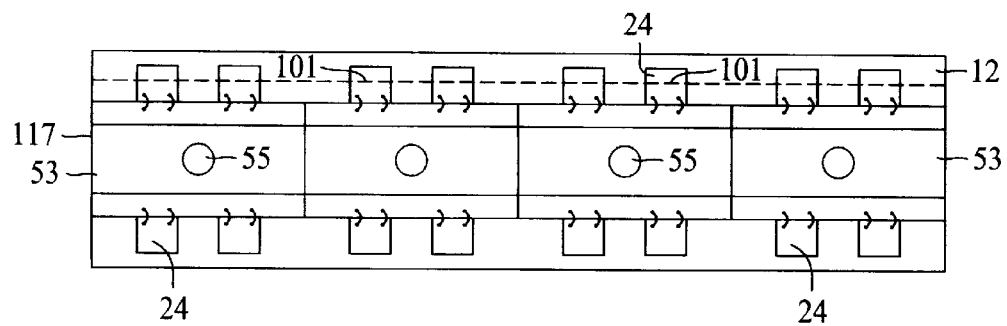
FIG. 19 is a top view of a linear air cooled power control unit employing two rows of devices.
Figure 20:
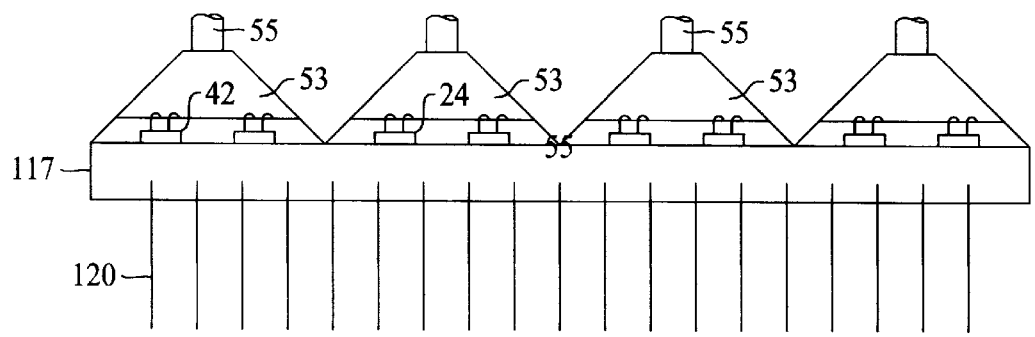
FIG. 20 is a front elevation view of the apparatus in FIG. 12.

Referring now to FIGS. 19 and 20, an alternate embodiment of a linear air cooled element 117 employs two rows of devices 24. As in FIG. 15, the centers of devices 24 lie substantially along line 101. The two rows of devices 24 are positioned on conductive substrate 12 for optimum heat transfer relative to fins 120. Second interconnects 53 are positioned between the two rows of devices 24 and have cluster drivers 26, similar to the layout shown in cluster 104 of FIG. 15. Second interconnects 53 are now perpendicular (FIG. 20) to conductive substrate 12 instead of parallel as in FIG. 15. This permits symmetrical and uniform second power port interconnects 42 to be made on both sides of second interconnects 53 from the row of devices 24 on each side. Miniature second interconnects 53 (FIG. 16) may alternatively be employed. As in FIG. 17, the planes of fins 120 are substantially orthogonal to line 101 passing through the center of devices 24. Mounting of fins 120 on the surface of conductive substrate 12 opposing devices 24 is similar to that described for FIG. 17. Series and paralleling of the power control units of FIGS. 19, 20 is similar to that for FIGS. 17, 18. Electrical symmetry is similar to that of FIGS. 15, 17, 18.

Figure 21:
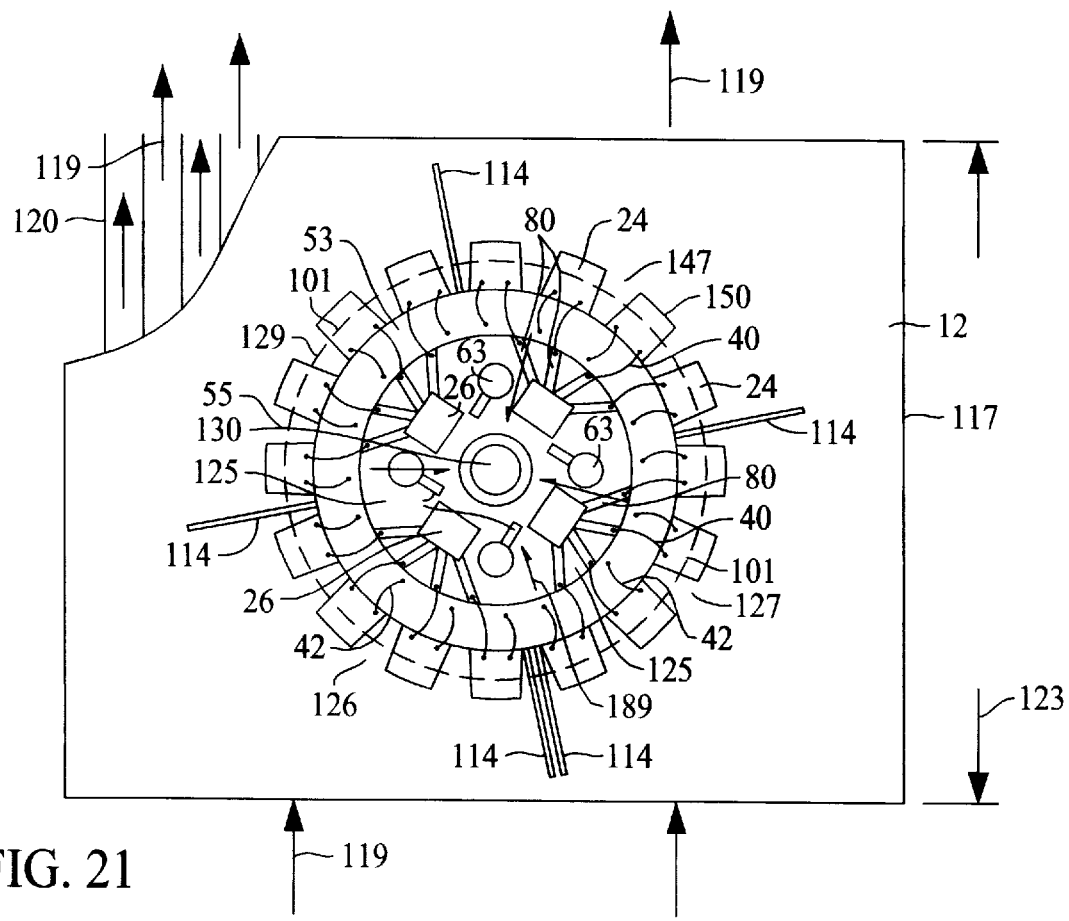
FIG. 21 is a top view of a circular symmetric air cooled power control unit with partial cutaways to illustrate driver configuration and air cooled fins.

Referring now to FIG. 21, a top view of an alternate embodiment of an air cooled power control unit 117 comprises devices 24 arranged about a central axis, e.g., in a circle. The line 101 joining the center of devices 24 is thus a polygon approximating a circle. For current flow 189 to be orthogonal to line 101, current flow 189 is illustratively radial (and preferably inward) to maintain smallest dimensions for minimum inductance. Second interconnect 53 is also circular and preferably concentric with line 101 which permits second power port interconnects 42 of uniform length from ail devices 24 to second power control unit interconnect 55. Second power control unit interconnect 55 extends vertically at the center of circular second interconnect 53. For electrical design considerations, device groups may be treated as a single element called a device cluster. or sometimes called a cluster. A cluster includes a cluster driver circuit 78, which may consist of a cluster driver 26, an isolation 61 means, an isolated power source 63 on board 125, and the output devices 24 driven by the cluster driver 26, which typically may range from one to eight output devices 24.

Referring against to FIG. 21, included on board 125 is the cluster driver 26, gate clamp diodes, isolated cluster driver DC power supply and filter capacitors, isolated pulse transformer, and coupling network collectively designated as an isolated power source 63. This circuit board provides a separate source coupling ground sheet which does not carry any of the main power current. Provided is a noninteractive gating mechanism such that the impedances for the main current path are essentially identical. Also, by use of a two sided board, a common drive sheet 80 is integrated with the separate common source sheet 79 into a low inductance structure.

Circular symmetric cluster driver board 125 is shown accommodating four isolated power sources 63 to drive four clusters. 126, 127, 128 and 129, each incorporating four devices 24. More or fewer power sources 63 may be accommodated to drive a specified number of clusters with the clusters typically incorporating from one to eight devices 24. Each cluster driver circuit 78, which includes a power source 63, a cluster driver 26 thus drives four devices 24, through electrically symmetrical common drive sheet 80. Radial slots 114 in conductive substrate 12 directed to the central axis 130 serve to partially isolate devices 24 in adjacent clusters 126, 127, 128 and 129. Multiple adjacent slots 114 may be employed to further enhance high frequency isolation of clusters. Fins 120, as seen in the partially cutaway portion of conductive substrate 12, are mounted on the surface of conductive substrate 12 opposing devices 24 (as described for FIG. 17) and cooled by air flow 119, for example from a fan (not shown) fins 120 extend the width 273 of conductive substrate 12, suitably configured as a flat rectangular plate although conductive substrate 12 may also be circular. The electrical symmetry of FIG. 21 is dramatic: the radial paths traversed by current 189 from any device 24 across second interconnect 53 and up second power control unit interconnect 55 is the same as every other device 24, which provides substantially uniform impedance for all devices 24 and consequent electrical symmetry, resulting in uniform current sharing.

Figure 22:
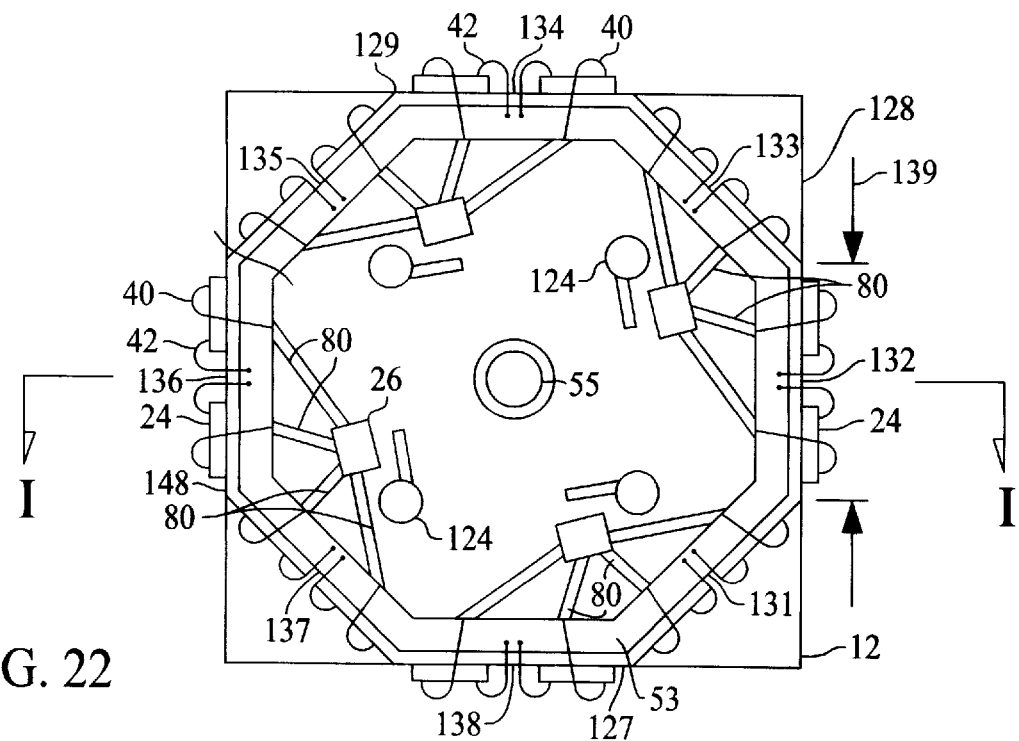
FIG. 22 is a top down view of a power converter with circular symmetric peripheral mounting of devices.

Referring now to FIGS. 22 and 23, shown is circular symmetric converter construction with peripheral mounting of devices 24 in contrast to the planar mounting of devices 24 of FIG. 21. The conductive substrate 12 is provided with multiple peripheral flats 131–138 upon which are thermally and electrically and mechanically mounted devices 24 (here shown as two devices per flat), though more than two or only one may be conveniently employed. Conductive substrate 12 is here shown as being made from square cross section metal such as copper or aluminum. The corners have been partially milled away to provide eight flats 131–138 of substantially uniform width 139. For adequate heat spreading to cooling fins 120, the height of 140 of electrode 12 is preferably equal to the radius 141, i.e., from the center to any flat. Height 142 of the comers of electrode 12 is maximized to provide improved heat spreading to fins 120 extending to corners 142 of conductive substrate 12. Second interconnect 53 here, of generally octagonal shape with second power control unit interconnect 55 attached, is mounted to and insulated from conductive substrate 12 by insulator 193. The generally circular or octagonal shape of second interconnect 53 minimizes inductance to conductive substrate 12.

Conductive substrate 12 is provided with centered hole 144. First power control unit interconnect 46 is centered in hole 144 and fixed in place by insulating material 145, e.g., epoxy. First power control unit interconnect 46 is attached to circular symmetric first interconnect 46, which may have multiple radial slots to provide a current path to devices 24. First interconnect 46 is then circumferentially connected. e.g., soldered at its periphery to surface 147 of conductive substrate 12 so as to insure circumferentially uniform current distribution. This construction is substantially identical to that employed in FIG. 21.

Slots 114 (not shown) may be provided on the peripheral surface of conductive substrate 12 to enhance the high frequency isolation or clusters 126, 127, 128 and 129. Slots 114 (not shown) may extend to, the top planar surface of conductive substrate 12 and extend radially inward toward the central axis in a manner similar to FIG. 21.

Figure 24:
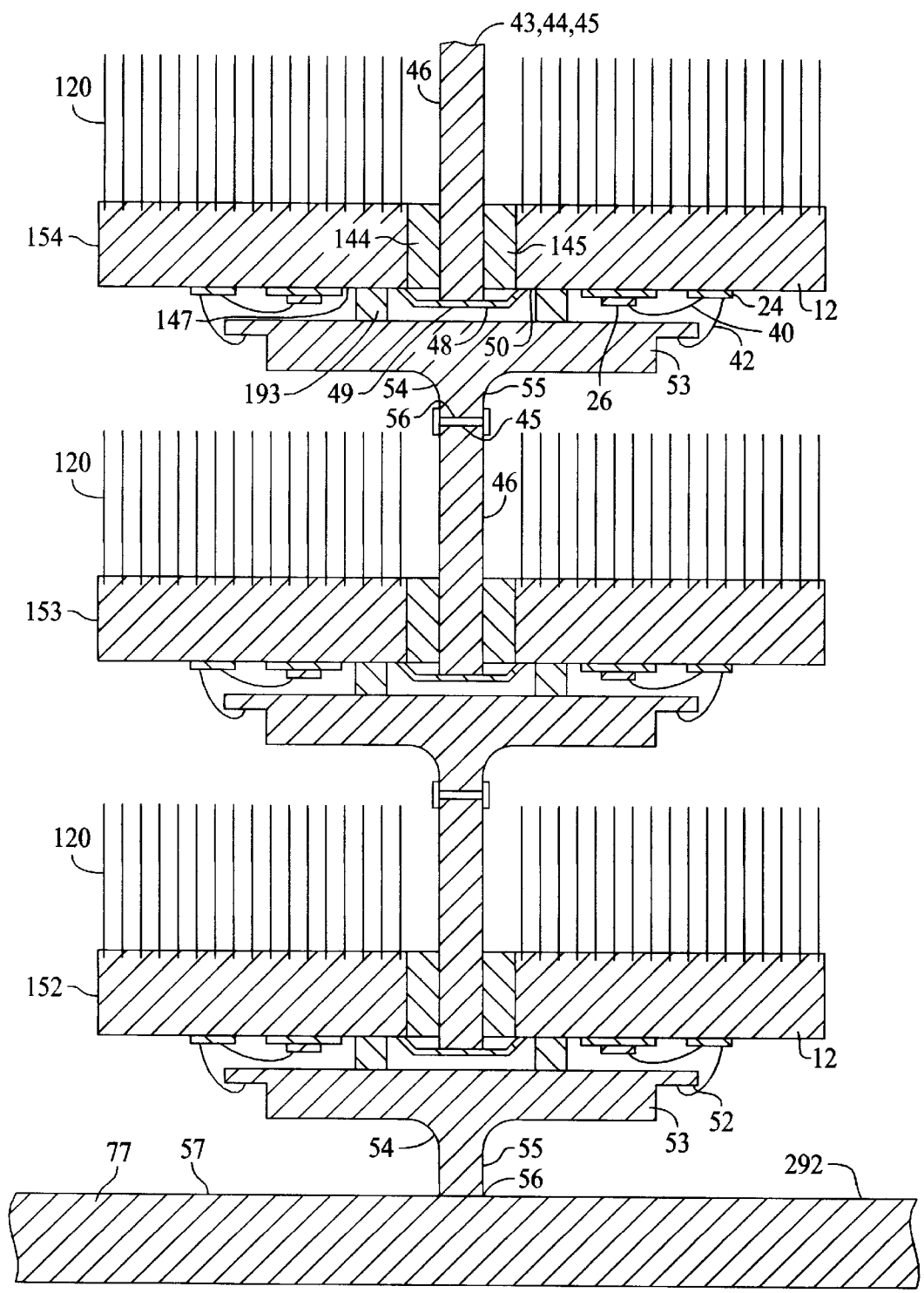
FIG. 24 is a cross section view of an air cooled voltage output stage comprising three power control units, mounted in voltage series connection.

Referring now to FIG. 24, a circuit assembly analogous to that of FIG. 21 in shown in cross section to further illustrate a plurality of power control units voltage connected in series. For convenience, three exemplary, power control units, 153, 153, 154 are shown, although any convenient number of power control units (e.g., two to twenty or more) may be stacked in similar fashion.

A central bore (opening) 144 is suitably provided in each conductive substrate 12, through which a first power control unit interconnect 46 is substantially coaxially positioned. With the power control units 153, 153, 154 voltage series stacked, a second power control unit interconnect 55 associated with power control unit 154 suitably transitions to first power control unit interconnect 46. In like manner, second power control unit interconnect 55 of stage 153 is interconnected with first power control unit interconnect 46 of stage 117. A suitable sleeve 155, which may be soldered to respective power control unit interconnects 55 and 46, provides electrical and mechanical connection between each respective second interconnect 55 and first power control unit interconnect 46. Thus, power control units 153, 153 and 154 are voltage seriesed stacked. In this way, if the devices are rated at, for example 500 volts, then three power control units connected in series is rated at 1500 volts. First power control unit interconnects 46 and second power control unit interconnects 55, may be of an appropriate material such as solid bar, tube or Litz wire.

The diameter of opening 144 is suitably larger than the diameter of second power control unit interconnect 55 to provide appropriate voltage isolation. Insulation 145, e.g., epoxy, suitably fills the space between first power control unit interconnect 46 and the inside diameter of opening 144. To provide for circular symmetric current distribution from first power control unit interconnect 46 to the surface 147 of conductive substrate 12 upon which devices 24 are mounted, a circular first interconnect 49 (which may be radially slotted) may be employed. More particularly, circular first interconnect 49 may be soldered to both first power control unit interconnect 46 and conductive substrate 12 at surface 147. If first power control unit interconnect 46 is Litz wire, the wire end protruding above the surface or conductive substrate 12 may be spread radially out in a generally uniform circumferential manner in a 360° pattern and soldered to the chip mounting surface 147 of conductive substrate 12 as was circular first interconnect 49. The return current path 292 through sheathe 77, shown in partial cross section, girdles the seriesed power control units in a close fitting sheathe, terminates at 58 (not shown) thereby minimizing stored field energy and providing counter flowing currents to minimize inductance. A suitable load, such as a motor, and an input power source are connected to 43 and 58.

First power control unit interconnect 46 (FIG. 24) may exhibit any desirable shape in cross section 156, e.g., elliptical, where it passes through the cross section containing cooling fins 120. First power control unit interconnect 46 may be made elliptical in the region of cooling fins 120, with its longitudinal axis in the direction of air flow for high strength, and the small axis orthogonal to the air flow for minimum pressure drop. Other geometries may also be employed to obtain desired heat transfer, strength, and pressure effects. The power control unit construction of FIGS. 22, 23 are generally similar to that of FIG. 21, and may also be series voltage connected in a manner analogous to that shown in FIG. 24. In general, cooling fins 120 of power control units 152, 153 and 154 are oriented parallel to each other to receive a common flow of cooling air.

The design of the assembly shown in FIG. 22 also exhibits substantial electrical symmetry: the current flow 189 from any of the paralleled devices 24 does not cross or merge, in any substantial manner, with the current from any of the other paralleled devices prior to converging or diverging at the first and second cluster power terminal where the current convergence or divergence is controlled and predetermined. All current paths, being substantially identical in construction, accordingly exhibit substantially identical impedances. The electrical symmetry resulting from the above ensures minimum device cross coupling and substantially uniform current sharing for best efficiency and maximum operating frequency.

Figure 25:
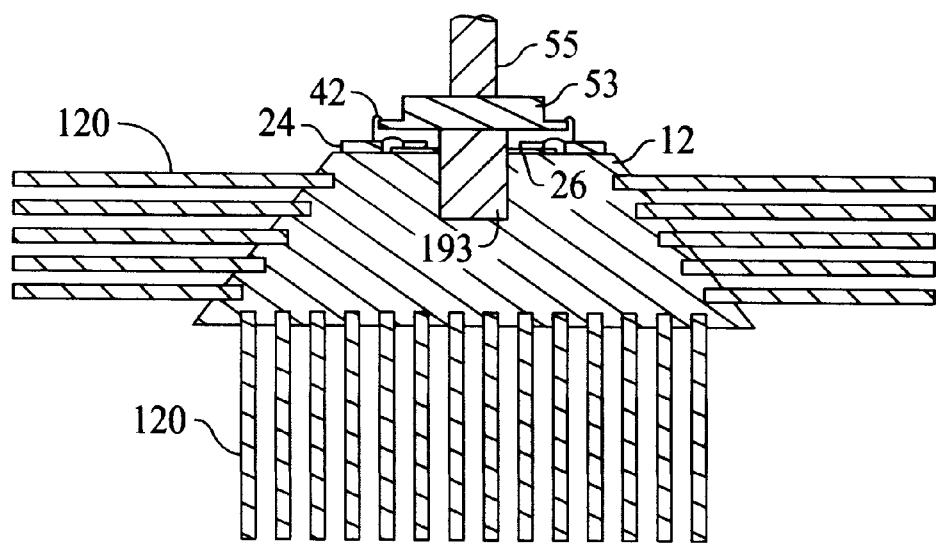
FIG. 25 is a cross section view of a circular symmetric air cooled power control unit with added radial fins.

Referring now to FIG. 25, an alternate embodiment of an power control unit is shown in cross section with a circular symmetric conductive substrate 12. A circular second interconnect 53 is suitably mounted on an insulator 193 with a second power control unit interconnect 55 fastened to second interconnect 53. Conductive substrate 12 is suitably circular such that all construction, i.e., respective devices 24, second interconnect 53 and second power control unit interconnect 55, may be conveniently concentrically disposed about the surface of conductive substrate 12. To reduce the size and weight of the assembly, as well as to maximize the cooling efficiency, additional fins 120 may be radically disposed about the circumferential surface of conductive substrate 12. Conductive substrate's 12 size and weight can be reduced with high heat transfer rates by employing a 45° heat transfer configuration, whereby the outer radial wall of conductive substrate 12 slopes at a 45° angle.

Figure 26:
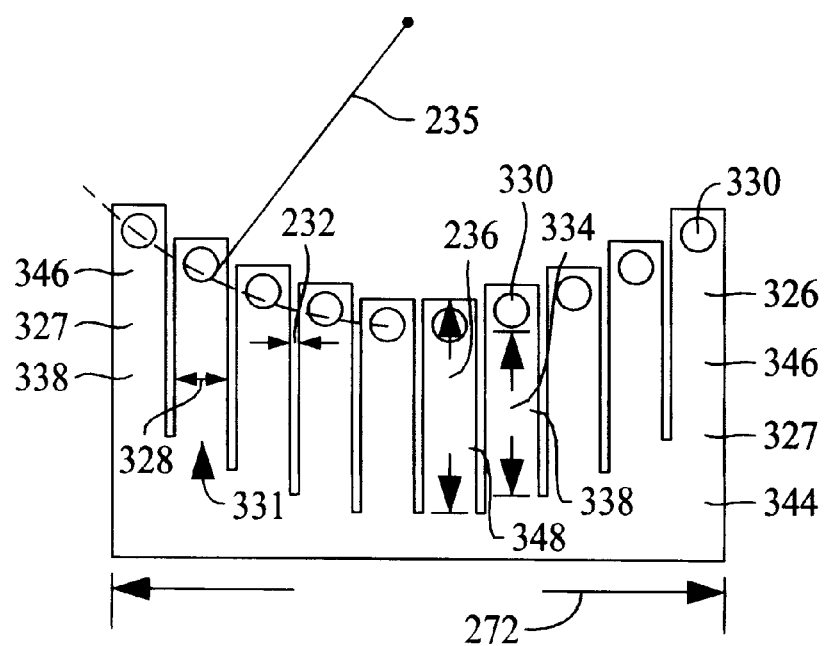
FIG. 26 is a top view of a slotted sheet first or second power control unit interconnects.
Figure 27:
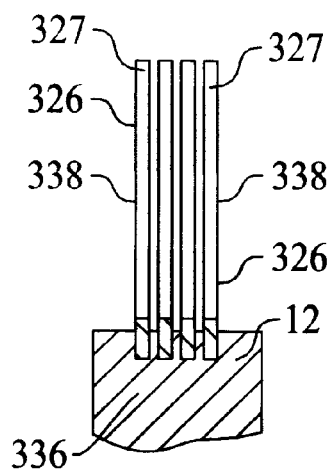
FIG. 27 is a cross section view of multiple slotted sheet first or second interconnect configured for connection to a conductive substrate or second power port interconnect.

An alternate design for power control unit first and second interconnects for air or liquid cooled linear power control units is shown in FIGS. 26, 27, 28 employing multiple paralleled and insulated slit sheet conductors. Referring now to FIG. 26, a slit sheet conductor 326, made of a suitable material, e.g., copper, copper alloys, aluminum, or the like, comprises alternating slits 232 and fingers 327. The thickness of sheet 326 may range from about 0.05 mm (0.002") to 2 mm (0.080"), with typical thicknesses being from 0.1 mm (0.004") to 0.4 mm (0.016"). In general, sheet thickness is desirably at least twice the skin current depth. The width of each slit 232 is suitably at least equal to the thickness of sheet 326 and preferably more than one and a half times to two times greater. The length 236 of each finger 327 is desirably at least three to five times, or more, than that of the sheet thickness. The length 236 of each finger 327 is substantially the same for all fingers. However, finger lengths may vary if finger widths 328 are adjusted to maintain constant impedance. The length 102 of sheet 326 is substantially the length 102 of the conductive substrate 12 or second interconnect 53 (FIG. 18) to which sheet 326 is attached. However, multiple lengths of sheet 326 may be employed in parallel to span conductive substrate length 102. The width 328 of finger 327 may be optimized with respect to the length 236 to accommodate the flexing and twisting required to bring all the holes 330 of fingers 327 into concentric registration, as seen in FIG. 28.

Respective screw clearance holes 330 are provided at the distant end of each finger 327. Both sides of sheet 326 are suitably coated with a thin insulating material 338 over length 334 of fingers 327. The edge of sheet 326 opposite holes 330, as well as the surfaces of sheet 326 in the vicinity or holes 330, are suitably without an insulating coating. The centers or clearance holes 330 are of uniform placement in close proximity to the extreme edges of fingers 327, and describe an approximate arc of radius 235. The base of fingers 327 also define an arc. Sheet 326 may be manufactured by, for example, chemical milling or stamping.

Conductive substrates (e.g., conductive substrate 12) may be provided with slots 336 (FIG. 27), which extends substantially the length 102 of the conductive substrate, for the insertion or multiple (e.g., four) sheets 326. The bases of sheets 326 are suitably soldered into slots 336, the solder only wetting the base of the sheets 326 with the insulation preventing the solder from wetting the fingers 327. Thus, the layers of sheets 326 are in close proximity to each other and the fingers 327 of each layer of sheets 326 are free to move independently and are electrically insulated from each other. With four layers of sheets 326 there is, in effect, four times the surface area and thus four times the high frequency current carrying capacity of a single sheet. The uniform finger dimensions provides uniform impedance which, when combined with uniform with uniform current flow from or to the conductive substrate, over the length 102 of the conductive substrates, maintaining electrical symmetry. Additionally, the second juncture can be a conductive bar of similar length to the conductive substrate to provide a similar multi-sheet construction.

Respective fingers 327 (FIGS. 26, 27, 28) are suitably manipulated (bent) such that respective holes 330 are aligned in succession to facilitate the journaling of a connector 340 thereunto. Referring now to FIG. 28, an input (or output) connector 340 which is drilled and tapped at its center to accommodate a screw 342. Fingers 327 of the layers of sheets 326 are now twisted 90° to bring all holes 330 of fingers 327 over the threaded hole in connector 340. Adjacent fingers 327 may be alternately twisted 90° to the right and then to the left to substantially cancel out inductance. Since extreme fingers 327 must travel further than the center finger to join at the center, the arc defined by approximate radius 235 provides the geometry needed for all fingers to join. Another arc defines the base of fingers 327 to maintain a substantially constant finger length 236. Insulation 338 on the external surfaces and sides of fingers 327 prevents shorting between fingers. The width 328 and length 236 of fingers 327 are designed to minimize the stresses related to the 90° twisting of fingers 327. Screw 342 which passes through all holes 330 then clamps the fingers 327 to a common electrical junction on connector 340 upon being screw in. Since insulation 338 did not extend to the region around the holes 330, excellent electrical contact is made. The connector 340 to finger 327 junction at holes 330 may now be soldered. The results are the same when used with a conductive substrate except the current is flowing in the reverse direction.

Figure 30:
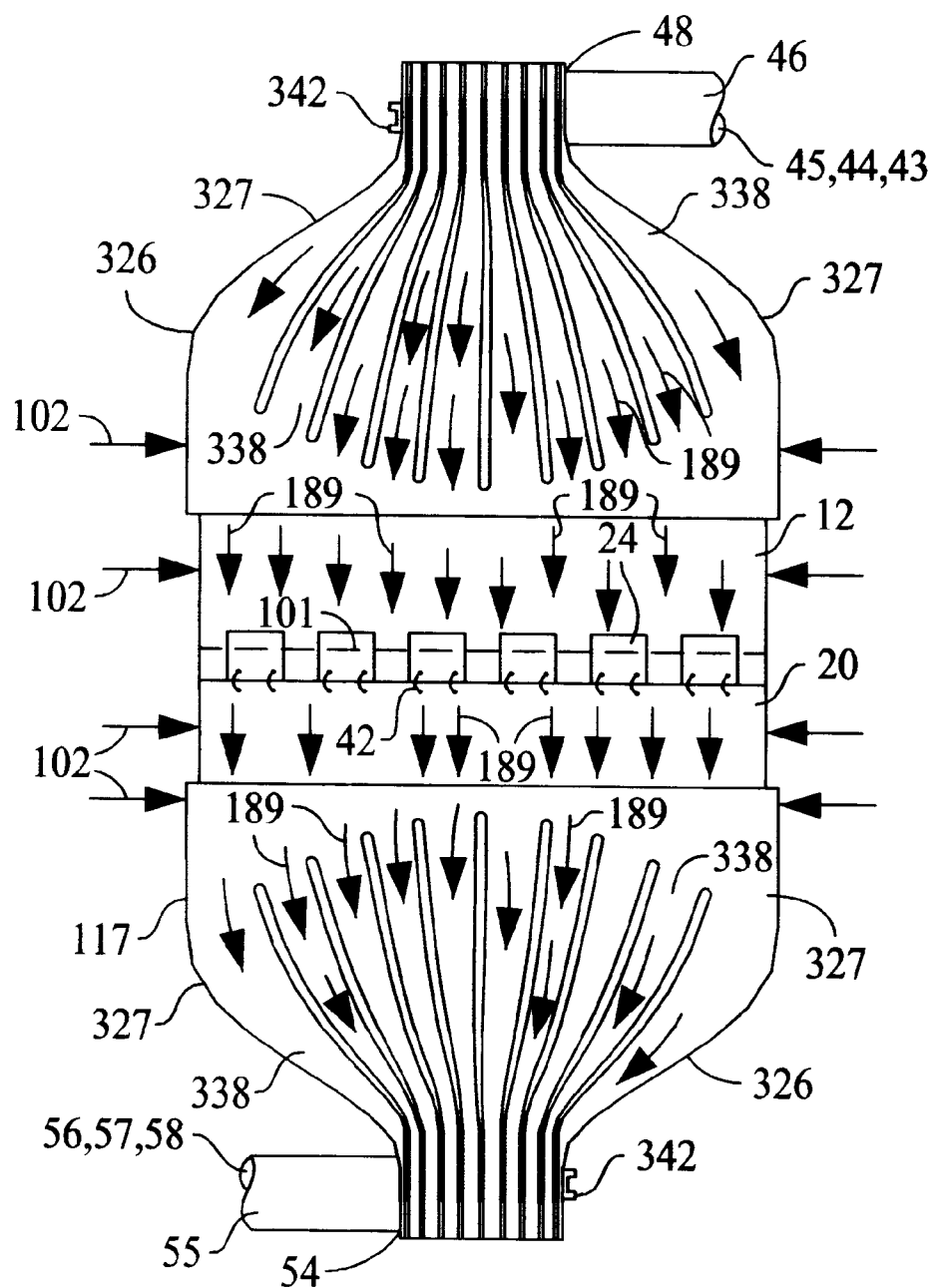
FIG. 30 is a top view of a linear air cooled single cluster power control unit with multiple paralleled slit sheet conductors for both first and second power control unit interconnects.

Referring again to FIG. 26, fingers 327 are of substantially uniform impedance. For a sheet 326 of uniform thickness, uniform impedance may be achieved with all fingers 327 having the same widths 328 and lengths 236. Alternatively, for a sheet 326 of uniform thickness, uniform impedance of fingers 327 may be achieved with a constant width 328 to length 236 ratio, that is, as length 236 is shortened, width 328 is narrowed proportionately. In this manner the arc described by approximate radius 235 increases in curvature. By progressively shortening the lengths fingers 327, and correspondingly narrowing widths 328 for constant impedance, when progressing from extreme fingers 346 toward center finger 348 the most compact size of twisted fingers 327 (FIGS. 26, 28, 30) may be obtained.

In an alternate embodiment, strips of sheet conductor, e.g., copper,.generally analogous to finger 327 may be employed instead of first power control unit interconnect 340. Like fingers 327, the copper sheets may be insulated on all surfaces except at each end which may have a screw clearance hole corresponding to hole 330 of finger 327 for interconnect purposes. The strip sheet may then be interleaved with fingers 327 and bolted together with screw 342 to form good electrical contact. The sheet strips being separate from each other may now twist and flex while extending to a fixed electrical connection. The multiple insulated parallel sheet strips provide a low inductance, high current path. The same construction may be applied to multiple parallel insulated strip tapered first and second interconnects. It is seen that multiple paralleled slotted and insulated sheet conductors 326 provide an electrically symmetric transition medium from an elongated source of current (conductive substrate 12) to a point connection as exemplified by first power control unit interconnect 340.

Figure 29:
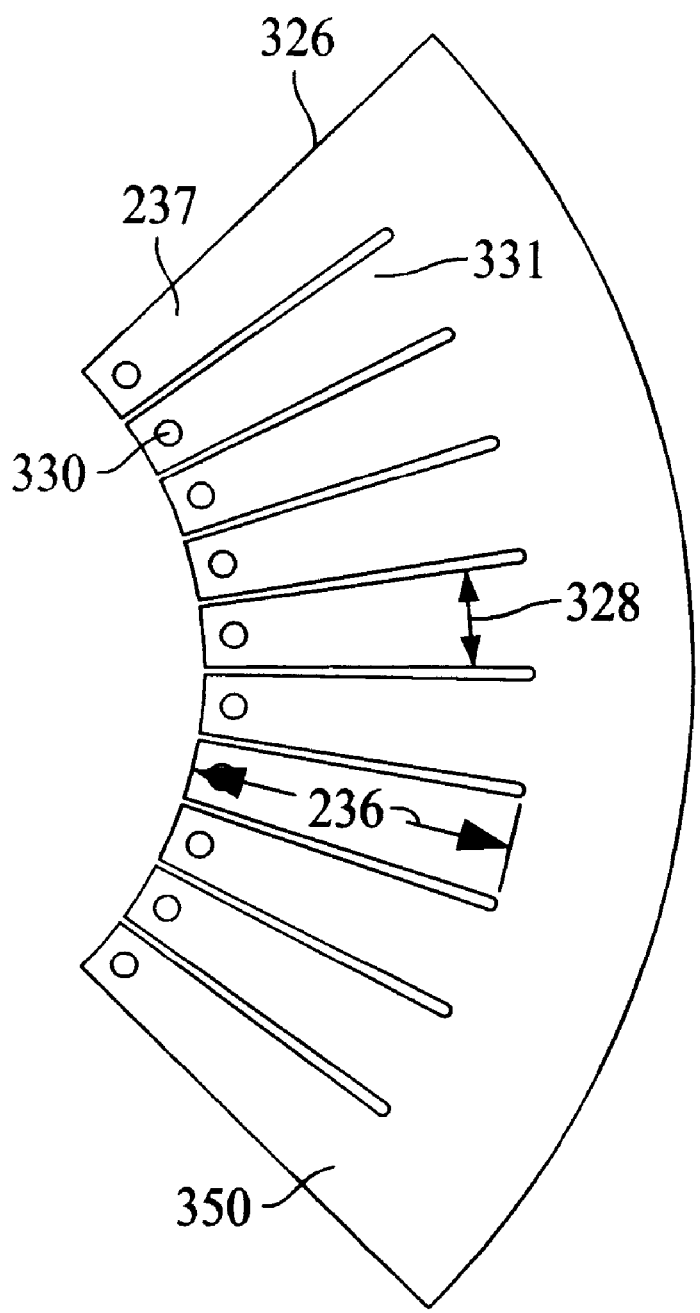
FIG. 29 illustrates a curved insulated slotted sheet first or second power control unit interconnects.

Referring now to FIG. 29, an alternate embodiment of a curved insulated slit sheet conductor 326 comprise clearance holes 330 disposed generally radially inward as shown from base 350 of specified radius. Fingers 237 may be bent 90° vertically (FIG. 21) resulting in base 350 becoming a flange that may be soldered to conductive substrate 12. Multiple curved insulated slit sheets 326 (FIG. 29) may be positioned (FIGS. 21) external to and uniformly surrounding the ring of devices 24. Multiple layers (as shows in FIG. 27) of curved slit sheet 326 conductors may be employed. As in FIGS. 28 and 30, fingers 327 are brought into alignment and joined together. Curved slitted sheet conductors may also be mounted on the circular construction of FIGS. 25 in the same manner as was done in FIG. 21.

The multiple paralleled and insulated slit sheet conductors 326 provide a transition, or transform, from an extended linear sheet current 189 to a point current at second power control unit interconnect 55. As best seen, for example in FIG. 30 and in cluster 103 of FIG. 15, a point source of current at apex 48 (first cluster power terminal) of first interconnect 49 suitably transitions to an extended uniform sheet current on slitted sheet 326 the first interconnect, whereupon the current is next fed to conductive substrate 12 and thence through devices 24 to the bar second juncture 52, all the while suitably maintaining parallel flow characteristics due to, inter alia, the uniform impedance of the circuit. Bar second juncture 52 discharges sheet current 189 again to a slitted sheet 326 second interconnect 53, which smoothly and uniformly transitions current 189 back to a point at the apex 54 (second cluster power terminal) of second power control unit interconnect 55. This same topology and construction may also be applied to various embodiments of the present invention.

Due to the symmetrical construction of slitted sheets 326, there is no crossing or merging of current 189 in the path from input connector 341 to output connector 340. The current flow 189 is substantially orthogonal, on average, to the line 101, joining the centers of devices 24. The first or second interconnect described in FIGS. 28, 29, 30, 31 may be suitably employed as first or second interconnects in the various embodiments of the present invention.

All circuit elements external to the first and second power connections are, in general, electrically isolated from the power control unit circuitry. Thus, in some of the embodiments described herein, the flexible first or second interconnects may assume arbitrary geometries when routed to and from the first and second power connections. Being electrically isolated, there is only inductive and capacitive coupling between the first and/or second interconnects and the circuit construct and thus, substantial electrical symmetry is maintained within the power control unit circuitry despite any arbitrary geometry of external connections.

Referring again to FIG. 30, an alternative embodiment of an air cooled linear power output driver 100 incorporates multiple paralleled and insulated slip sheet conductors 326 for the first interconnect to conductive substrate 12, and for the second interconnect from the bar second juncture 52 is suitably shaped and prepared with a nesting slots 336 for receiving multiple sheets 326, as shown and described in connection with FIG. 27. Sheets 326 extend substantially the length 102 of bar second juncture 52. In like manner, conductive substrate 12 is prepared with slots 336 for receiving multiple sheets 326, also of length 102. Sheets 326 in both conductive substrate 12 and bar second juncture 52 comprise respective first and second interconnects as described above. In this matter, a single set of first and second power control unit interconnects serve for input and output instead of the multiple first and second power control unit interconnects 46 and 55 of FIG. 15. This configuration results in greater simplicity and lower manufacturing and production costs. For clarity, first and second power control unit interconnects are shown on opposite sides of power output driver 100. For compactness, both the first and second power control unit interconnects may be on the same side of power output driver 100, whereby a counter flow current is established which minimizes inductance.

Figure 31:
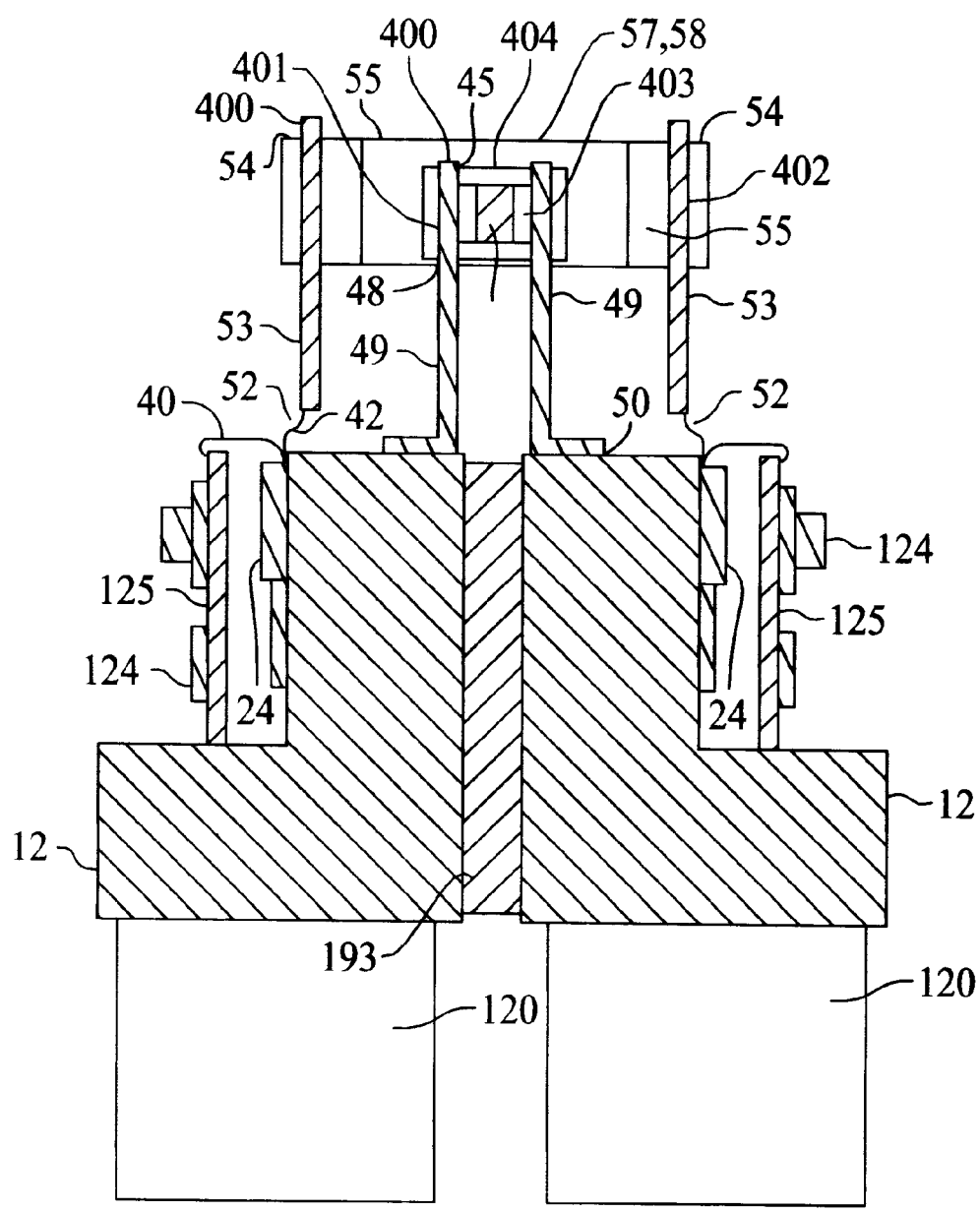
FIG. 31 is a cross section view of an air cooled converter employing two "L" shaped electrode and attached cluster drive boards.
Figure 32:
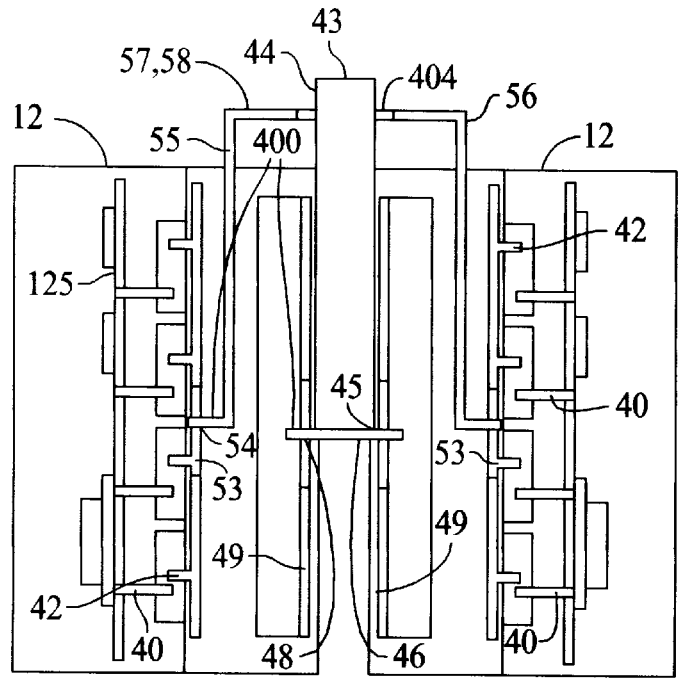
FIG. 32 is a partial sectional top down view of the converter of FIG. 31.

Referring now to FIGS. 31–33, shown in a further preferred embodiment of the circuit assembly of the present invention. Conductive substrate 12 is shown in cross section as being generally "L" shaped. As best seen in FIGS. 31, two "L" conductive substrates 12 may be mounted back to back and separated by electrical insulator 193. Devices 24, four each in this example, are mounted on faces of each conductive substrate 12 opposing insulation 193 as shown in FIGS. 31–33. Second interconnect 53 and first interconnect 49 (analogous to those described in FIGS. 19 and 20) are mounted as shown in FIGS. 31–33. First interconnect 49 is mounted close to the wall of conductive substrate 12, for example abutting insulator 193, and second interconnect 53 is suitably disposed in close proximity to the face of conductive substrate 12 having devices 24 mounted thereon in order to minimize the lengths of respective leads 42 to reduce inductance. At the apex 400 of both first interconnect 49, slots 401 are suitably disposed at the midpoint of apex 400. Similar slots may be prepared in the apex 400 of second interconnects 53. A sheet cross piece 403 is suitably attached to and centered with first power control unit interconnect 46, and conveniently fits into conductive substrate slots 401 and is fastened, e.g., soldered, into place to provide an electrically symmetric connection. In a similar manner, second power control unit interconnect 55, which may be a sheet of metal having an aperture 404 for first power control unit interconnect 46 to protrude there through, may be formed as shown with each end fitting into slots 402 and fastened in place, e.g., soldered. Each conductive substrate 12 is suitably configured as a single cluster.

In accordance with one aspect of the present invention, the foregoing electrically symmetric construction permits inductors, etc. to be connected while maintaining substantially uniform and minimal impedance characteristics. The foregoing illustrates electrically symmetric parallel electrical connection of second 53 and first 49 interconnects from the two clusters to thereby increase current output. To provide for electrical series connection of the two "L" shaped conductive substrate 12, interconnection similar to that shown in FIG. 18 may be employed.

Again referring to FIGS. 31 and 32, a rectangular cluster driver board 125 is provided for each "L" shaped conductive substrate 12 to drive devices 24 mounted thereon, included on board 125 is the cluster driver 26, gate clamp diodes, isolated cluster driver DC power supply and filter capacitors, isolated pulse transformer, and coupling network collectively designated as an isolated power source 124. This circuit board provides a separate source coupling ground sheet which desirably does not carry any of the main power current. Also provided is a noninteractive gating mechanism such that the impedances for the main current path are essentially identical. By use of a two sided board, a common driver sheet may be integrated with the separate common source sheet into a low inductance structure. In this context, a cluster comprises the cluster driver board 125 and four devices 24.

Figure 34:
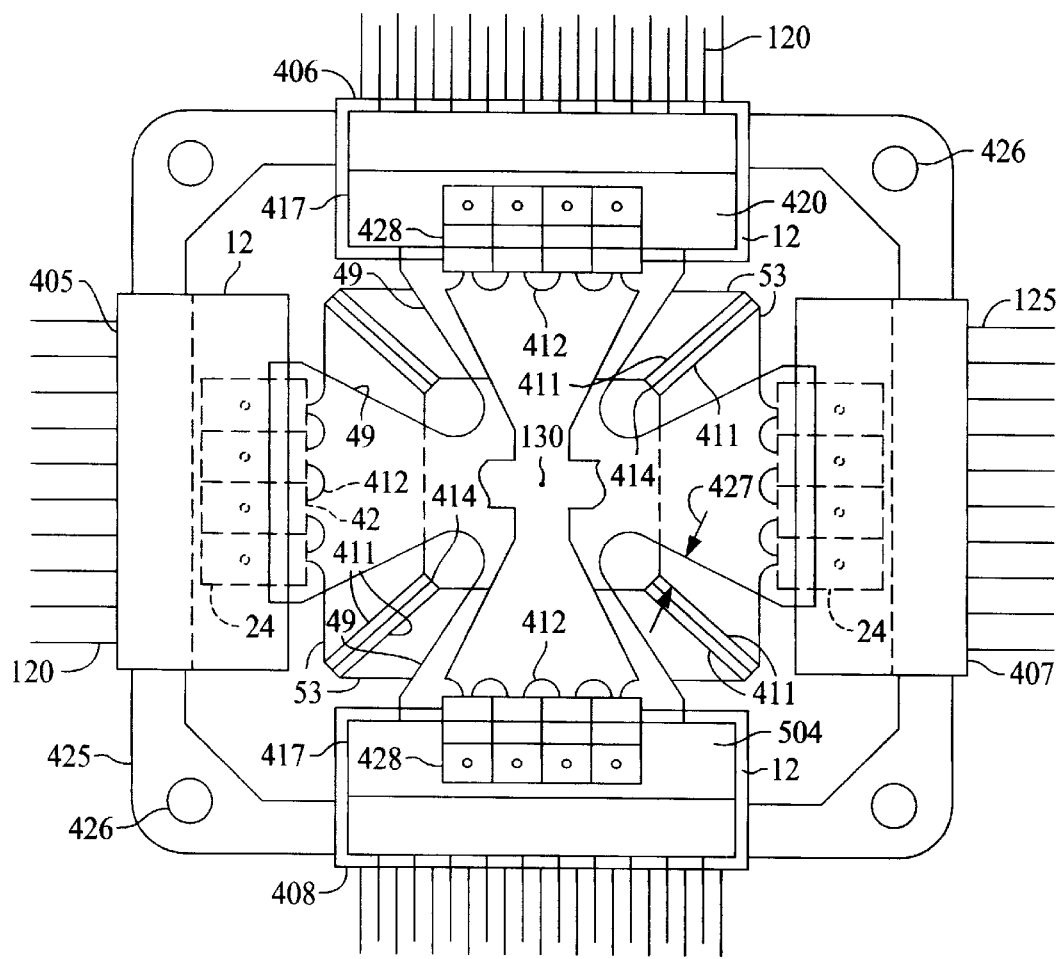
FIG. 34 is a top down view of a power control unit structured as part of a converter output driver which has four linear air cooled paralleled clusters.
Figure 35:
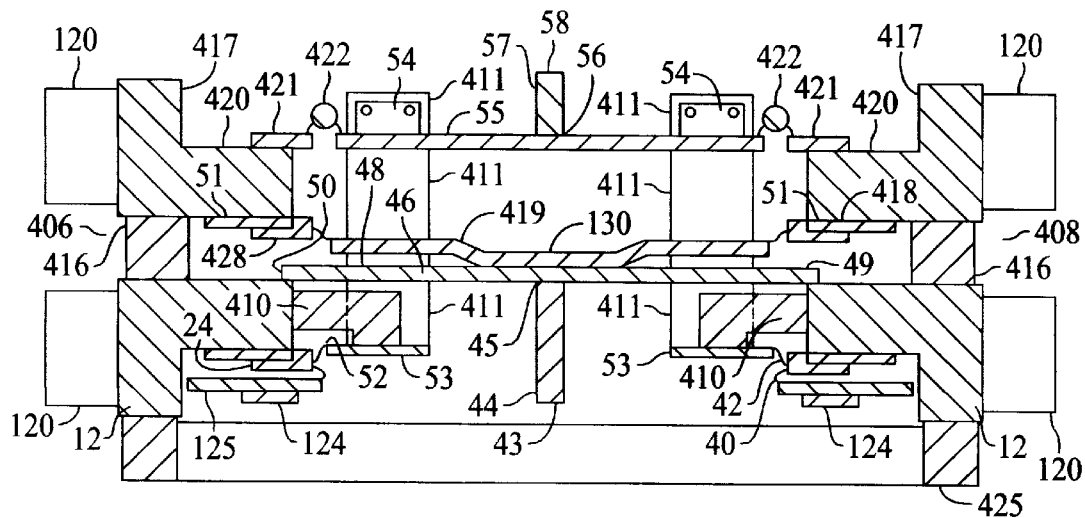
FIG. 35 is a cross section view of FIG. 34 through the two clusters with their attendant catch diodes.
Figure 36:
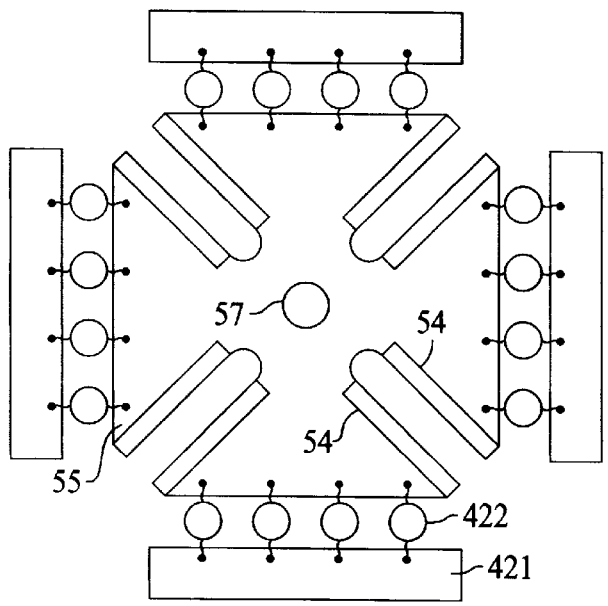
FIG. 36 is a top down view of the second power control unit interconnect incorporating RF bypass capacitors.

Referring now to FIGS. 34–36, shown is a further preferred embodiment for the paralleling of linear air cooled power control units such a those of FIGS. 17, 18. For illustration purposes, the "L" shaped conductive substrates 12 of FIGS. 31–33 will be employed. FIG. 34 shows a top down view of four paralleled clusters 405, 406, 407 and 408 comprising a power control unit. For clarity purposes, dotted phantom outlines of hidden parts, e.g., devices 24, are employed to illustrate construction, and in general, only one layer deep of phantom outlines are used in order to avoid confusion. Also, to best illustrate and describe construction, certain overlying structures are partially removed. Except for catch diode and catch diode interconnect construction, clusters 405, 406, 407 and 408 are substantially identical FIG. 35 is a cross section of FIG. 34 through clusters 406, and 408 and catch diodes 409 and catch diode interconnect 419.

Figure 37:
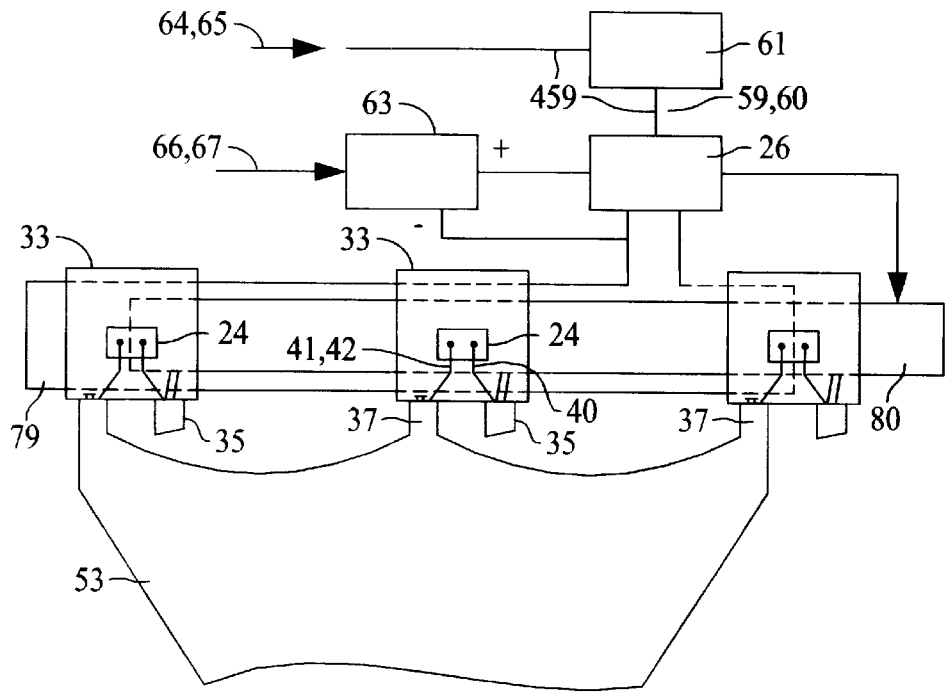
FIG. 37 is an illustration electrically symmetric implementation of a cluster driver attached to multiple output devices via common driver and source sheets.

With continued reference to FIGS. 34 and 35, clusters 405, 406, 407 and 408 each have one "L" shaped conductive substrate 12 with four devices 24 and associated cluster driver circuit 78 mounted on board 125 as shown in FIG. 37, 38. Insulators 410 are mounted on conductive substrates 12 of clusters 405, 406, 407 and 408 to which second interconnects 53 are attached. Second interconnect 53 suitably include "wings" 411 bent up 90° at each end. Source leads 37 are attached to curved segments 412 in second interconnect 53 to provide a good impedance match to devices 24.

Clusters 405, 406, 407 and 408 are now mounted by screws, adhesive, etc. on insulating frame 413 which may be of regular shape. Frame 413, which may be made of a suitable insulator such as epoxy or ceramic, serves to provide accurate mechanical counting and alignment of clusters 405, 406, 407 and 408 and electrical isolation between conductive substrates 12. Threaded metallic inserts 426 may be provided in the corners of frame 413 for mounting. Clusters 405, 406, 407 and 408 are positioned such that mating surfaces 414 of "wings" 411 of second interconnects 53 are substantially flush with each other, and then fastened together by means such as solder, nuts and screws, etc. The next step is to mount first interconnect 49, which may be a single piece in the general shape of a Maltese Cross 510, to commonly interconnect conductive substrates 12 in clusters 405, 406, 407 and 408. Adequate spacing 415 between wings 411 of second interconnect 53 and first interconnect 49 is provided for voltage stand-off.

Referring again to FIG. 35, insulating spacer 416 is mounted on conductive substrates 12 of clusters 406 and 408 by means such as screws or adhesives. Conductive heat sink 417 also in the shape of L's are then mounted on insulators 416. Catch diodes 409 are mounted on surface 410 of conductive heat sink 417. Conductive heatsink 417 and associated fins 120 may be of substantially the same dimensions as conductive substrates 12 and fins 120. Diode interconnect 419 provides an electrically symmetric path from catch diodes 409 to the center axis 130 where diode interconnect 419 joins first interconnect 486. Construction of conductive heat sink 417, catch diodes 409 and diode interconnect 419 is also shown in FIG. 34. For clarity, subsequent superimposed construction will be restricted to FIG. 35 and 36 to avoid confusion in FIG. 34.

Referring again to FIG. 35, surface 420 of conductive heatsink 417 opposing surface 410 have conductive strips 421 mounted thereon which are parallel to the edge of conductive heatsink 417 and extend substantially the length of the catch diode 409 array. Connected to strips 421 are one leg of RF bypass capacitors 422. To the other leg of capacitors 422 is second power control unit interconnect 55 which extends to clusters, 405, 406, 407 and 408. Second power control unit interconnect 55 has bent up "wings" 423 corresponding to "wings" 411 of second interconnect 53 such that mating surfaces may be screwed or soldered together. Second power output driver connection member 57 is positioned on the center axis 130 of second power control unit interconnect 55.

Referring now to FIG. 36, shown is an assembled top down view of second power control unit interconnect 55, capacitors 422, strips 421 and second power output driver connection member 57. The construction of FIG. 36 would drop down on FIG. 34 with strips 421 mounting on conductive heatsink 416 of clusters 405–408. Cross section view of FIG. 35 illustrates this construction. Strips 421 may be screwed or soldered in place in faces 420 of conductive heatsinks 417 as shown in FIG. 35.

Electrical symmetry is demonstrated in the embodiments of FIGS. 34–36. Referring again to FIG. 34, though the current path from outer devices 24 on second interconnect 53 to "wings" 411 is shorter than for inner devices 24, as seen in clusters 405 and 407, the current path for the inner devices 24 to second power output driver connection member 57 on second power control unit interconnect 55 (FIGS. 35 and 36) is correspondingly shorter. Thus, the impedance seen by all devices 24 to be centered second power output driver connection member 57 is substantially equal thereby providing electrical symmetry and uniform current sharing. Shown in FIGS. 34–36 are four paralleled clusters. Two of these paralleled assemblies may be seriesed for high voltage operation in a manner similar to that of FIGS. 18, 24.

The electrically symmetric construction and resulting consistent impedance of device cluster construction assures uniform current sharing if the drive function, i.e., the voltage-current into each of the first and second control ports of the output power devices is substantially identical. An embodiment of this design principle comprises an isolated cluster driver including an isolated power source and drive signal. Employing the same electrical symmetry principles used for the high current paths of the device cluster, the output of the cluster driver is directed to the output power device control terminals, which for a MOSFET are the source and gate leads. With MOSFETs as an example, on each devide a second control port interconnect and first control port interconnect would be attached directly to a common source sheet and common driver sheet. The output from the cluster driver would then drive between these two common sheets thereby providing substantially uniform voltage-current characteristics to each of the output devices, and where the drive signal and high output current share a common path. the impedance seen by all said power devices is substantially identical and minimal.

Figure 38:
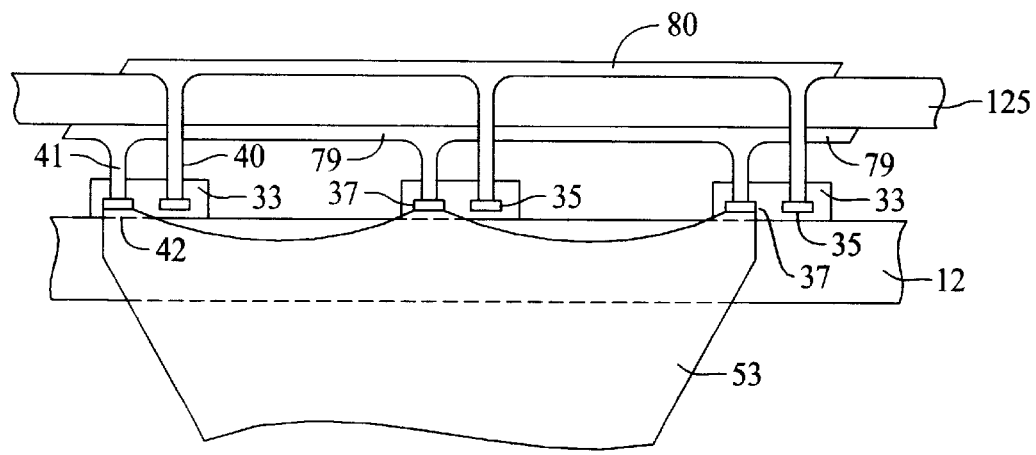
FIG. 38 is a further illustration of FIG. 37.

Referring now to FIG. 37, shown is a schematic of the above described cluster driver circuit 78 construction. Common drive signal 64, 65 is conducted to isolation 61 through co-axial cable 459 which then feeds said signal to cluster driver 26. Input power 66, 67 is fed to isolated power supply 63 which in turn powers common source sheet 79 mounted on board 125, and cluster driver 26. Output drive line 530 interconnects cluster driver 26 and common drive sheet 80 which is preferably mounted on the surface of board 125 opposing common source sheet 79 (FIG. 38). Coaxial cable 459 comprises first 64 and second 65 cluster control connections to isolation 61 and also comprises first 59 and second 60 cluster control terminals between isolation 61 and cluster driver 62. Devices 24, here shown as packaged die, but which may be die are mounted on conductive substrate 12 (FIG. 38). Second power port 42 and second control port interconnects 41 and control port interconnect 40 lead bond wires, internal to packaged device 24 connect respectively to external package source leads 37 and gate leads 35. Source leads 37 from multiple devices 24 are connected to second interconnect 53. External source 37 and gate 35 leads are cut as short as possible to minimize inductance. Board 125 is mounted close to multiple devices 24 to minimize interconnect lengths for minimal inductance.

Again, referring to FIG. 37, it is seen that internal source bonding wires (second control and power port interconnects 41, 42) and part of source lead 37 comprises the common path for both high current and the drive signal. Source bonding wires 41, 42 are part of device package manufacture and are maintained as short as possible to minimize inductance. With automated or semiautomated lead wire bonding technique, second control and power port interconnect 41, 42 layout geometry within the package is highly reproducible from device to device with very small variation. Thus, from device to device, the impedance of the common high current and drive signal path is substantially identical, and with short bonding wire 41, 42 length it is also minimal. Clipping source lead 37 short as possible also minimizes its inductive contribution. To further reduce second control and power port interconnect 41, 42 length, die 24 would be used. This eliminates device 24 packaging 34 and the associated added bonding wire 41, 42 length as well as the need for source lead 37. Thus, minimal inductance and lowest overall impedance is obtained. The foregoing illustrates electrically symmetric construction of an isolated cluster driver circuit with a power source, common drive and source sheets and first and second control port interconnects wherein substantially uniform voltage-current characteristics are provided to each of the output devices thereby assuring substantially uniform current sharing. The above design description may be employed in the various embodiments of the present invention.

Figure 39:
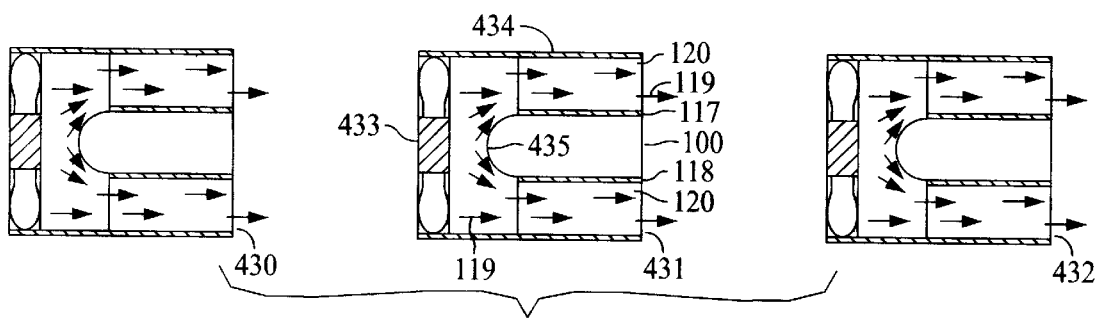
FIG. 39 is a three phase air cooled power source comprising three single phase packages of fan, housing, and voltage stages.

Referring now to FIG. 39, three single phase AC air cooled modules 430, 431, 432 may be combined to provide three phase power. To provide the proper phase relationship, the output voltage and current from each module is 120° out phase with the other two. The major elements of each module are fan 433, outer shroud 434, inner shroud 435 and the output stage 100 composed of element 117, 118. Each module 430, 431, 432, may also incorporate other power conditioning components such as capacitors, transformers etc. A suitable output stage 100 for use in module 430, 431, 432 composed of air cooled linear elements 117, 118 is shown in FIGS. 15–17, or alternatively the air cooled circular construct of FIG. 19 may be adapted. External shroud 434 serves to confine within fin structure 120 the air flow 119 from fan 433. Shroud 434, made of a dielectric, e.g., plastic, also serves as electrical insulation for fins 120 which are at elevated electrical potential elements 117, 118 within modules 430, 431, 432, may be voltage seriesed, current paralleled or operated in the AC mode as described for FIGS. 15–17. In addition to confining air flow 119, it is obvious that shroud 434 may be made of metal to serve as the return current path 292 as described in FIG. 24. A compact, unitized three phase power module 430–432 has been described that is easy to replace and repair.

Embodiments of the present invention employing multiple paralleled devices are characterized by electrically symmetric construction and a minimal output impedance. With electrical symmetry, the impedance between each device and the output terminal is substantially equal, i.e., uniform current sharing and minimal mutual cross coupling between devices. The current symmetry permits a system whereby the drive signal timing and amplitude to each device can be made substantially uniform.

Although the invention has been described in conjunction with the appended drawings, those skilled in the art will appreciate that the scope of the invention is not so limited. Various modifications in the selection and arrangement of the various components discussed herein may be made without departing from the spirit of the invention as set forth in the appended claims.

What is claimed is:

1. A power control unit comprising first and second power connections, and at least one cluster, said cluster comprising;
   first and second cluster power terminals;
   first and second cluster control terminals;
   a plurality of semiconductor devices mounted on a metallic substrate, each of said semiconductor devices having first and second power ports defining a controlled current path therebetween, and first and second control ports defining a control path for controlling the current flow through said controlled current path;
   an electrically conductive first interconnect having respective opposing ends, said first cluster power terminal and said first juncture located at said respective ends of said first interconnect;
   an electrically conductive second interconnect having respective opposing ends, said second cluster power terminal and said second juncture located at said respective ends of said second interconnect;
   said first interconnect connected, at said first juncture, to said metallic substrate;
   said plurality of devices disposed relative to said first interconnect such that current flow paths between said first cluster power terminal and said first power ports of each of said plurality of devices are each of substantially equal impedance;
   a second power port interconnect connecting said second interconnect to said second power port of each of said plurality of devices and connected, at a predetermined second juncture, to said second interconnect; and
   said plurality of devices disposed relative to said second interconnect such that current flow paths between said device second power ports and said second cluster power terminal are each of substantially equal impedance.

2. The power control unit of claim 1 wherein:
   the impedance of said current flow paths between said first cluster power terminal and said first power ports of said devices is minimized; and
   the impedance of said current flow paths between said second cluster power terminal and said second power ports of said devices is minimized.

3. A power control unit according to claim 1 wherein said metallic substrate comprises at least one of copper, a copper alloy, aluminum, molybdenum and tungsten.

4. The power control unit of claim 1 wherein:
   said first control ports of each of said plurality of devices are electrically connected to said first cluster control terminal such that said current paths between said first cluster control terminal and said first control port of each of said plurality of devices are of substantially equal impedance; and said second control ports of each of said plurality of devices are electrically connected to said second cluster control terminal such that said current paths between said second cluster control terminal and said second control port of each of said plurality of devices are of substantially equal impedance.

5. The power control unit of claim 4 wherein:
the impedance of said current flow paths between said first cluster power terminal and said first power ports of said devices is minimized;
the impedance of said current flow paths between said second cluster power terminal and said second power ports of said devices is minimized;
said first control ports of each of said plurality of devices are electrically connected to said first cluster control terminal such that said current paths between said first cluster control terminal and said first control port of each of said plurality of devices are of substantially minimal impedance; and
said second control ports of each of said plurality of devices are electrically connected to said second cluster control terminal such that said current paths between said second cluster control terminal and said second control port of each of said plurality of devices are of substantially minimal impedance.

6. The power control unit of claim 5 wherein said cluster further comprises:
an electrically and thermally conductive substrate having a first surface to which a power port of each of said plurality of devices is electrically and thermally connected in predetermined relative disposition, said substrate operating as a heat sink for said plurality of devices, said substrate being electrically connected to at least one of said interconnects.

7. The power control unit of claim 6 wherein said device power ports comprise conductive elements such that said control path includes a portion of said controlled current path and said electrical connection to said second cluster control terminal is disposed to minimize the impedance of said portion of said controlled current path included in said control path.

8. The power control unit of claim 5 wherein said second control port of each of said plurality of devices comprises one of said power ports of said device.

9. The power control unit of claim 5 further comprising a plurality of semiconductor device clusters.

10. The power control unit of claim 9 wherein:
said unit further comprises first power control unit interconnects electrically connecting said first cluster power terminal of each cluster to said power control unit first power connection, such that the impedance of each of said current flow paths between said first control port of each device to said power control unit first power connection is substantially identical;
second power control unit interconnects electrically connecting said second cluster power terminal of each cluster to said power control unit second power connection, such that the impedance of each of said current flow paths between said second power port of each device to said power control unit second power connection is substantially identical;
said first cluster control terminal of each of said clusters electrically isolated from said first cluster control terminal of said other clusters; and
said second cluster control terminal of each of said clusters is electrically isolated from said second cluster control terminal of said other clusters.

11. The power control unit of claim 10 wherein said power control units are connected in series between said unit power connections.

12. The power control unit of claim 10 including a plurality of electrically paralleled groups of series connected power control units wherein:
each said group of series connected power control units comprises a first power output driver connection member electrically connecting said first power connection of a series connected power control unit to said power output driver first power output driver connection, such that the impedance of each of said current flow paths between said first power port of each device to said power output driver first power output driver connection is substantially identical;
each said group of series connected power control units comprises a second power output driver connection member electrically connecting said second power connection of a series connected power control unit to said power output driver second power output driver connection, such that the impedance of each of said current flow paths between said second power port of each device to said power output driver second power output driver connection is substantially identical.

13. The power control unit of claim 5 wherein:
a cluster driver, an isolator and isolated power supply are incorporated to provide the control signal to devices.

14. The power control unit of claim 13 wherein:
said cluster driver is at least one of passive and active function.

15. The power control unit of claim 5 wherein:
said power control unit comprises at least one cluster having a first power connection, a first power control unit interconnect, a first cluster power terminal, a first interconnect, a first juncture, a conductive substrate, a first power port interconnect, and a first power port, and a second power port, a second power port interconnect, a second juncture, a second interconnect, a second cluster power terminal, a second power control unit interconnect, and a second power connection; and
at least one of said first power connection, first power control unit interconnect, a first cluster power terminal, a first juncture, a first interconnect conductive substrate, first power port interconnect and a first power port combine with the remainder in such a manner that at least two connections merge into at least one of a point, a line and a curve, becoming a single connection.

16. The power control unit of claim 5 wherein:
said power control unit comprises at least one cluster having a first power connection, a first power control unit interconnect, a first cluster power terminal, a first interconnect, a first juncture, conductive substrate, first power port interconnect, and a first power port, and a second power port, a second power port interconnect, a second juncture, a second interconnect, a second cluster power terminal, a second power control unit interconnect, and a second power connection; and
at least one of said second power connection, second power control unit interconnect, second cluster power terminal, second interconnect, second juncture, second power port interconnect, and second power port combine with the remainder in such a manner that at least two connections merge into at least one of a point, a line and a curve, becoming a single connection.

17. The power control unit of claim 5 wherein the current flow through a first power connection, then through a first cluster power terminal and then through a first power port, comprising a first current path;

the current then flowing through a second power port which then flows through a second cluster power terminal and then through a second power connection thereby comprising a second current path;

the current flow in said first and second current paths is parallel to and substantially concentric to a line which defines the center axis of an enclosing concentric conductive current return member;

the first power connection and the corresponding terminus of said member comprise the first terminus of the power output driver connection;

the second power connection and the corresponding end of said member comprise the second terminus of the power output driver connection.

18. The power control unit of claim 5 wherein the current flow through a first power connection, then through a first cluster power terminal and then through a first power port, comprising a first current path;

the current then flowing through a second power port which then flows through a second cluster power terminal and then through a second power connection thereby comprising a second current path;

the current in said first and second current paths is substantially centered between and proximate to two co-planar conductive ground/neutral current return planes;

a first power connection and the terminus of the first power output driver connection member is connected to and through an input power source to said return current planes;

a second power connection and the terminus of the second power output driver connection member is connected to and through a load to said return current planes.

19. The power control unit of claim 5 wherein the current flow through a first power connection, then through a first cluster power terminal and then through a first cluster power terminal and then through a first power port, comprising a first current path;

the current then flowing through a second power port which then flows through a second cluster power terminal and then through a second power connection thereby comprising a second current path;

the current in said first and second current paths lying in at least one plane that is co-planar to and proximate to a conductive ground/neutral current return plane;

a first power connection and the terminus of the first power output driver connection member is connected to and through an input power source to said return current planes;

a second power connection and the terminus of the second power output driver connection member is connected to and through a load to said return current planes.

20. The power control unit of claim 5 wherein the current flow through a first power connection, then through a first cluster power terminal and then through a first power port, comprising a first current path;

the current then flowing through a second power port which then flows through a second cluster power terminal and then through a second power connection thereby comprising a second current path;

the current flow in the current carrying members comprising said first current path is substantially parallel to and in the opposite direction to the current flow in the current carry members of said second current path, said first and second current carrying members lying proximate to each other and having minimized impedance.

21. In the apparatus of claim 5 wherein the plurality of devices comprising at least one cluster, being disposed in a generally circular configuration, generally centered to at least one of a first and second cluster power terminal, wherein the current flow between said first and second cluster power terminals is radial, on average, with respect to a line joining the centers of said devices, the line being a polygon of a generally circular character.

22. The power control unit of claim 5 wherein:

said conductive substrate first surface includes a first edge, said plurality of devices comprising at least one cluster disposed on the conductive substrate first surface such that a nominal line joining the centers of said devices is substantially parallel to said edge; and the current flow between a first cluster power terminal and a second cluster power terminal is substantially orthogonal, on average, to the line joining the center of said devices.

23. The power control unit of claim 5 wherein at least one of said interconnects comprises a conductive sheet tapered to an apex.

24. The power control unit of claim 23 wherein said tapered conductive sheet includes apertures to provide plural current paths to said apex of substantially equal impedance.

25. The apparatus of claim 5 further comprising at least one liquid cooled concave curved heat exchange surface, said heat exchange surface having extended surfaces lying substantially in the direction of coolant flow, said extended surfaces being composed of at least one of linear and curved geometries, and said extended surfaces having heights and spacings ranging from about 0.1 mm to 5 mm.

* * * * *